(12) United States Patent
Campbell et al.

(10) Patent No.: US 8,014,150 B2
(45) Date of Patent: Sep. 6, 2011

(54) COOLED ELECTRONIC MODULE WITH PUMP-ENHANCED, DIELECTRIC FLUID IMMERSION-COOLING

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 12/491,281

(22) Filed: Jun. 25, 2009

(65) Prior Publication Data
US 2010/0328889 A1 Dec. 30, 2010

(51) Int. Cl.
*H05K 7/20* (2006.01)
*G06F 1/20* (2006.01)
*H01L 23/34* (2006.01)

(52) U.S. Cl. .............. 361/700; 361/679.47; 361/679.53; 361/679.54; 361/699; 361/702; 361/703; 361/704; 361/719; 165/80.4; 165/104.33; 165/185; 165/908; 257/686; 257/714; 257/715

(58) Field of Classification Search .............. 361/679.52–679.54, 699–704, 361/707, 719; 165/80.4–80.5, 104.33, 185; 165/908; 257/714–715, E23.085; 438/122
See application file for complete search history.

(56) References Cited

U.S. PATENT DOCUMENTS

| | | | |
|---|---|---|---|
| 2,643,282 A | 6/1953 | Greene | |
| 3,109,485 A | 11/1963 | Fortier | |
| 3,616,533 A | 11/1971 | Heap et al. | |

(Continued)

FOREIGN PATENT DOCUMENTS

JP 8-254512 A 10/1996

(Continued)

OTHER PUBLICATIONS

Iyengar et al., "Apparatus and Method for Facilitating Cooling of an Electronics System", U.S. Appl. No. 11/957,619, filed Dec. 17, 2007.

(Continued)

*Primary Examiner* — Robert J Hoffberg
(74) *Attorney, Agent, or Firm* — Dennis Jung, Esq.; Kevin P. Radigan, Esq.; Heslin Rothenberg Farley & Mesiti P.C.

(57) ABSTRACT

Cooled electronic modules and methods of fabrication are provided with pump-enhanced, dielectric fluid immersion-cooling of the electronic device. The cooled electronic module includes a substrate supporting an electronic device to be cooled. A cooling apparatus couples to the substrate, and includes a housing configured to at least partially surround and form a sealed compartment about the electronic device. Additionally, the cooling apparatus includes dielectric fluid and one or more pumps disposed within the sealed compartment. The dielectric fluid is in direct contact with the electronic device, and the pump is an impingement-cooling, immersed pump disposed to actively pump dielectric fluid within the sealed compartment towards the electronic device. Multiple condenser fins extend from the housing into the sealed compartment in an upper portion of the sealed compartment, and a liquid-cooled cold plate or an air-cooled heat sink is coupled to the top of the housing for cooling the condenser fins.

18 Claims, 16 Drawing Sheets

U.S. PATENT DOCUMENTS

| | | | |
|---|---|---|---|
| 4,064,300 | A | 12/1977 | Bhangu |
| 4,108,242 | A | 8/1978 | Searight et al. |
| 4,201,195 | A | 5/1980 | Sakhuja |
| 4,323,914 | A | 4/1982 | Berndlmaier et al. |
| 4,622,946 | A | 11/1986 | Hurley et al. |
| 4,750,086 | A | 6/1988 | Mittal |
| 4,833,567 | A | 5/1989 | Saaski et al. |
| 5,006,924 | A | 4/1991 | Frankeny et al. |
| 5,063,476 | A | 11/1991 | Hamadah et al. |
| 5,126,919 | A | 6/1992 | Yamamoto et al. |
| 5,168,919 | A | 12/1992 | Berenholz et al. |
| 5,183,104 | A | 2/1993 | Novotny |
| 5,220,804 | A | 6/1993 | Tilton et al. |
| 5,308,920 | A | 5/1994 | Itoh |
| 5,349,831 | A | 9/1994 | Daikiku et al. |
| 5,351,748 | A | 10/1994 | Dagan |
| 5,411,077 | A | 5/1995 | Tousignant |
| 5,508,884 | A | 4/1996 | Brunet et al. |
| 5,608,610 | A | 3/1997 | Brzezinski |
| 5,634,351 | A | 6/1997 | Larson et al. |
| 5,718,117 | A | 2/1998 | McDunn et al. |
| 5,720,338 | A | 2/1998 | Larson et al. |
| 5,781,411 | A | 7/1998 | Feenstra |
| 5,854,092 | A | 12/1998 | Root et al. |
| 5,963,425 | A | 10/1999 | Chrysler et al. |
| 6,000,908 | A | 12/1999 | Bunker |
| 6,134,108 | A * | 10/2000 | Patel et al. .................... 361/695 |
| 6,193,905 | B1 | 2/2001 | Yamada et al. |
| 6,237,223 | B1 | 5/2001 | McCullough |
| 6,366,462 | B1 | 4/2002 | Chu et al. |
| 6,378,605 | B1 | 4/2002 | Kutscher et al. |
| 6,431,260 | B1 | 8/2002 | Agonafer et al. |
| 6,474,074 | B2 | 11/2002 | Ghoshal |
| 6,490,160 | B2 | 12/2002 | Dibene et al. |
| 6,519,151 | B2 | 2/2003 | Chu et al. |
| 6,549,408 | B2 | 4/2003 | Berchowitz |
| 6,550,263 | B2 | 4/2003 | Patel et al. |
| 6,550,531 | B1 | 4/2003 | Searls et al. |
| 6,571,569 | B1 | 6/2003 | Rini et al. |
| 6,817,196 | B2 | 11/2004 | Malone et al. |
| 6,817,405 | B2 | 11/2004 | Kamath et al. |
| 6,938,678 | B1 * | 9/2005 | Bortolini et al. ............. 165/80.4 |
| 6,938,680 | B2 | 9/2005 | Garner et al. |
| 6,992,888 | B1 | 1/2006 | Iyer |
| 7,077,189 | B1 | 7/2006 | Reyzin et al. |
| 7,079,393 | B2 | 7/2006 | Colgan et al. |
| 7,134,289 | B2 | 11/2006 | Patel et al. |
| 7,254,030 | B2 | 8/2007 | Chiba et al. |
| 7,284,389 | B2 * | 10/2007 | Sharma et al. .................. 62/310 |
| 7,307,841 | B2 * | 12/2007 | Berlin et al. .................. 361/699 |
| 7,349,213 | B2 | 3/2008 | Campbell et al. |
| 7,362,574 | B2 | 4/2008 | Campbell et al. |
| 7,365,981 | B2 | 4/2008 | Myers et al. |
| 7,369,410 | B2 | 5/2008 | Chen et al. |
| 7,375,962 | B2 | 5/2008 | Campbell et al. |
| 7,380,409 | B2 | 6/2008 | Campbell et al. |
| 7,450,385 | B1 | 11/2008 | Campbell et al. |
| 7,477,513 | B1 | 1/2009 | Cader et al. |
| 7,495,914 | B2 | 2/2009 | Tilton et al. |
| 7,522,422 | B2 | 4/2009 | Chiba et al. |
| 2001/0006101 | A1 | 7/2001 | Chu et al. |
| 2002/0062945 | A1 | 5/2002 | Hocker et al. |
| 2002/0118511 | A1 | 8/2002 | Dujari et al. |
| 2003/0205363 | A1 | 11/2003 | Chu et al. |
| 2004/0246683 | A1 * | 12/2004 | Honsberg-Riedl et al. ... 361/720 |
| 2006/0039111 | A1 | 2/2006 | Huang |
| 2006/0118280 | A1 | 6/2006 | Liu |
| 2006/0162365 | A1 | 7/2006 | Hoang et al. |
| 2006/0191675 | A1 | 8/2006 | Fletcher et al. |
| 2006/0196640 | A1 | 9/2006 | Siu |
| 2007/0133173 | A1 * | 6/2007 | Hsiung et al. ................. 361/699 |
| 2007/0201210 | A1 | 8/2007 | Chow et al. |
| 2007/0258213 | A1 | 11/2007 | Chen et al. |
| 2008/0002363 | A1 | 1/2008 | Campbell et al. |
| 2008/0225478 | A1 | 9/2008 | Goettert et al. |
| 2009/0284918 | A1 | 11/2009 | Chou |
| 2010/0326628 | A1 * | 12/2010 | Campbell et al. ........ 165/104.21 |
| 2010/0328882 | A1 * | 12/2010 | Campbell et al. ............. 361/689 |
| 2010/0328890 | A1 * | 12/2010 | Campbell et al. ............. 361/700 |
| 2010/0328891 | A1 * | 12/2010 | Campbell et al. ............. 361/700 |

FOREIGN PATENT DOCUMENTS

JP          09-116056 A          5/1997

OTHER PUBLICATIONS

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03, Resubmitted on IDS filed on Sep. 22, 2010.

Campbell et al., "Liquid Cooling Apparatus and Method of Facilitating Cooling of an Electronic System", U.S. Appl. No. 12/168,259, filed Jul. 7, 2008.

Ellsworth, Jr., et al., "System and Method for Facilitating Cooling of a Liquid-Cooled Electronics Rack", U.S. Appl. No. 11/942,207, filed Nov. 19, 2007.

Campbell et al., "Hybrid Air and Liquid Coolant Conditioning Unit for Facilitating Cooling of One or More Electronics Racks of a Dada Center", U.S. Appl. No. 11/944,680, filed Nov. 26, 2007.

Campbell et al., "Method and Apparatus for Defect Detection in a Cold Plate", U.S. Appl. No. 12/053,762, filed Mar. 24, 2008.

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

Campbell et al., "Cooling Apparatus and Method of Fabrication Thereof with a Cold Plate Formed In Situ on a Surface to be Cooled", U.S. Appl. No. 12/143,289, filed Jun. 20, 2008.

Campbell et al., "Apparatus and Method for Facilitating Pumped Immersion-Cooling of an Electronic Subsystem", U.S. Appl. No. 12/256,628, filed Oct. 23, 2008.

Chee, B., "Supermicro Water Cooled Blades", Info World, Geeks in Paradise, (Mar. 5, 2008), http://weblog.infoworld.com/geeks/archives/2008/03.

Office Action for U.S. Appl. No. 12/491,287, dated Aug. 19, 2010.

Notice of Allowance for U.S. Appl. No. 12/491,289, dated Aug. 27, 2010.

Office Action for U.S. Appl. No. 12/491,293 (U.S. Patent Publication No. 2010/0328891 A1), dated Mar. 13, 2011.

* cited by examiner

COOLED ELECTRONIC MODULE WITH PUMP-ENHANCED, DIELECTRIC FLUID IMMERSION-COOLING

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to cooling apparatuses and cooled electronic modules with pump-enhanced, dielectric fluid immersion-cooling of one or more heat-generating electronic devices.

BACKGROUND OF THE INVENTION

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

SUMMARY OF THE INVENTION

In one aspect, the shortcomings of the prior art are overcome and additional advantages are provided through the provision of a cooling apparatus for facilitating cooling of a heat-generating electronic device. The cooling apparatus includes a housing configured to at least partially surround and form a sealed compartment about the electronic device to be cooled. Further, dielectric fluid is disposed within the sealed compartment, and the electronic device to be cooled is at least partially immersed within the dielectric fluid. At least one pump is also disposed within the sealed compartment for actively pumping dielectric fluid disposed within the sealed compartment towards the electronic device to be cooled to facilitate cooling thereof.

In another aspect, a cooled electronic module is provided which includes a substrate and an electronic device to be cooled disposed above the substrate. The module further includes a cooling apparatus for cooling the electronic device. The cooling apparatus includes a housing, configured to at least partially surround and form a sealed compartment about the electronic device, and dielectric fluid disposed within the sealed compartment, wherein the electronic device is at least partially immersed within the dielectric fluid. At least one pump is also disposed within the sealed compartment for actively pumping dielectric fluid disposed within the sealed compartment towards the electronic device to be cooled to facilitate cooling thereof.

In a further aspect, a method of fabricating a cooled electronic module is provided. The method includes: securing a housing about an electronic device to be cooled, the housing being configured to at least partially surround and form a sealed compartment about the electronic device to be cooled; disposing dielectric fluid within the sealed compartment, wherein the electronic device to be cooled is at least partially immersed within the dielectric fluid; disposing at least one pump within the sealed compartment for actively pumping dielectric fluid disposed within the sealed compartment towards the electronic device to be cooled to facilitate cooling thereof, wherein the at least one pump includes at least one impingement-cooling, immersed pump disposed within the sealed compartment configured to actively pump dielectric fluid drawn from a lower region of the sealed compartment towards the electronic device to be cooled; and providing a plurality of condenser fins extending into the sealed compartment in an upper portion of the sealed compartment, the plurality of condenser fins facilitating cooling of dielectric fluid vapor rising to the upper portion of the sealed compartment, and providing one of a liquid-cooled cold plate or an air-cooled heat sink coupled to a top wall of the housing in thermal contact with the plurality of condenser fins for cooling the plurality of condenser fins.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
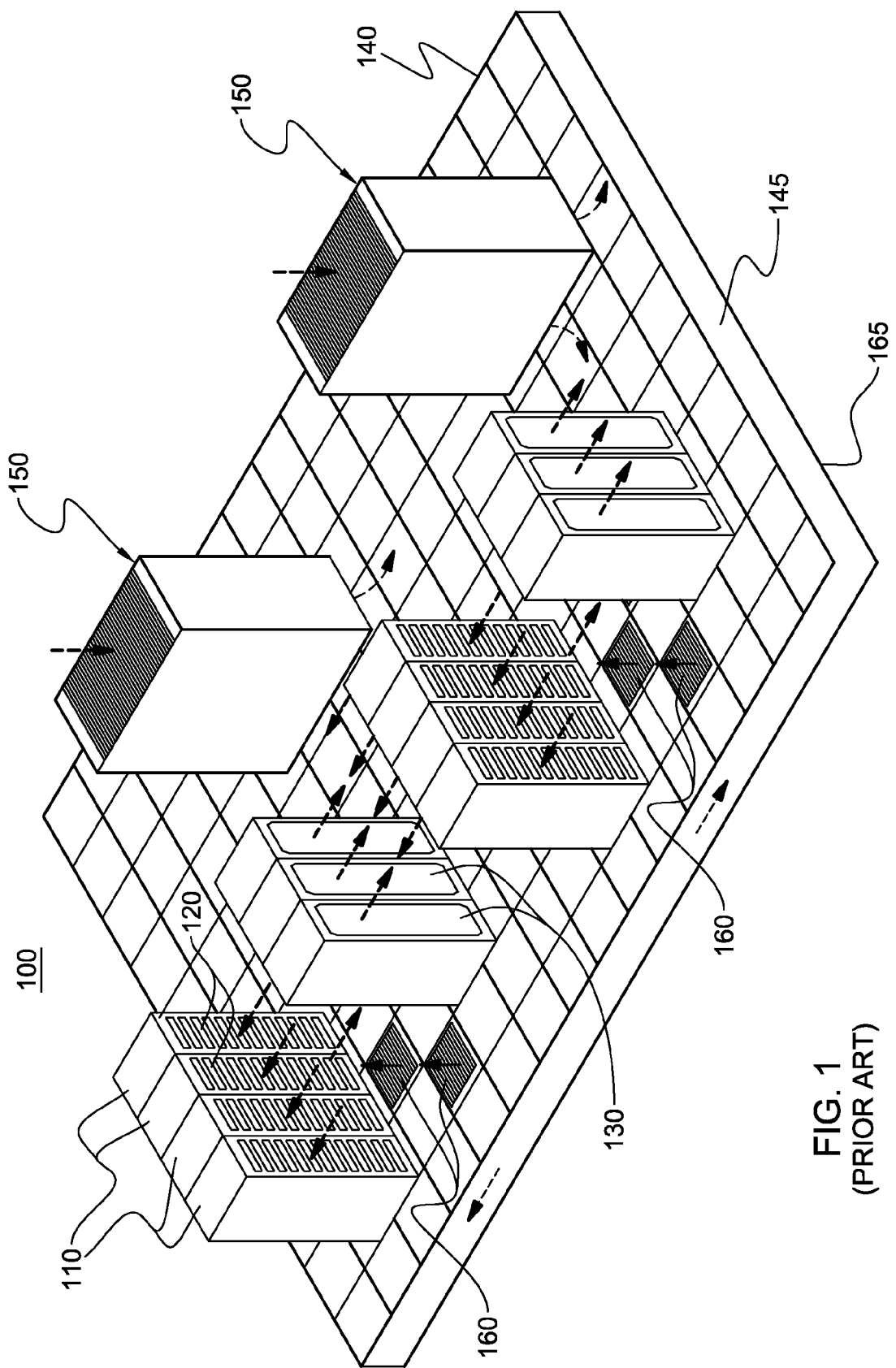
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronics system, and may be, for example, a stand alone computer processor having high, mid or low end processing capability. In one embodiment, an electronics rack may comprise multiple electronics subsystems or drawers, each having one or more heat-generating components disposed therein requiring cooling. "Electronics subsystem" refers to any sub-housing, blade, book, drawer, node, compartment, etc., having one or more heat-generating electronic devices disposed therein. Each electronics subsystem of an electronics rack may be movable or fixed relative to the electronics rack, with the rack-mounted electronics drawers and blades of a blade center system being two examples of subsystems of an electronics rack to be cooled.

"Electronic device" refers to any heat-generating electronic device of, for example, a computer system or other electronics unit requiring cooling. By way of example, an electronic device may comprise one or more integrated circuit dies (or chips) and/or other electronic devices to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronics subsystem, while "secondary heat-generating component" refers to an electronic device of the electronics subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
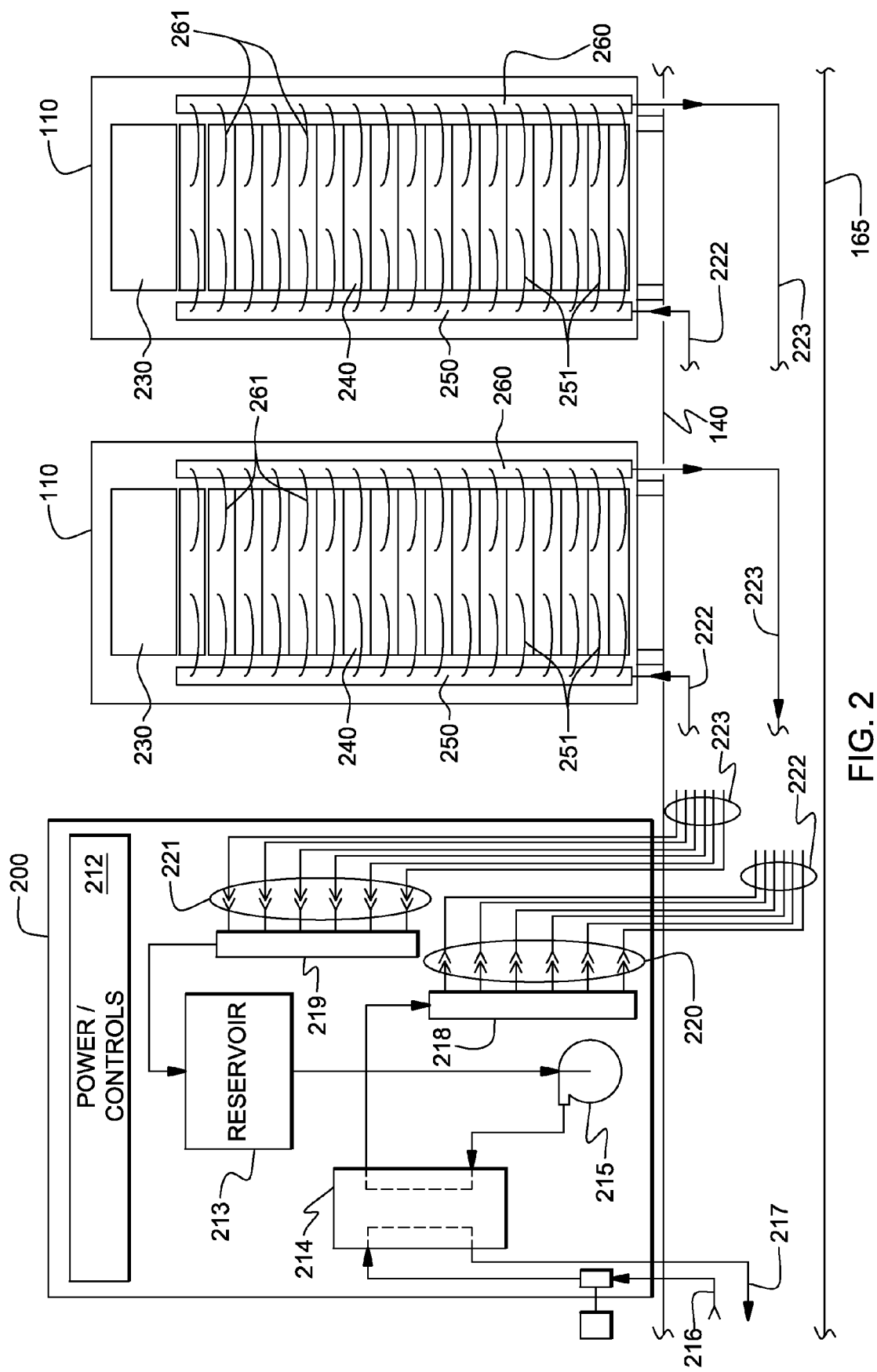
FIG. 2 depicts one embodiment of a coolant distribution unit for liquid-cooling of one or more electronics racks of a data center, in accordance with an aspect of the present invention.
Figure 3:
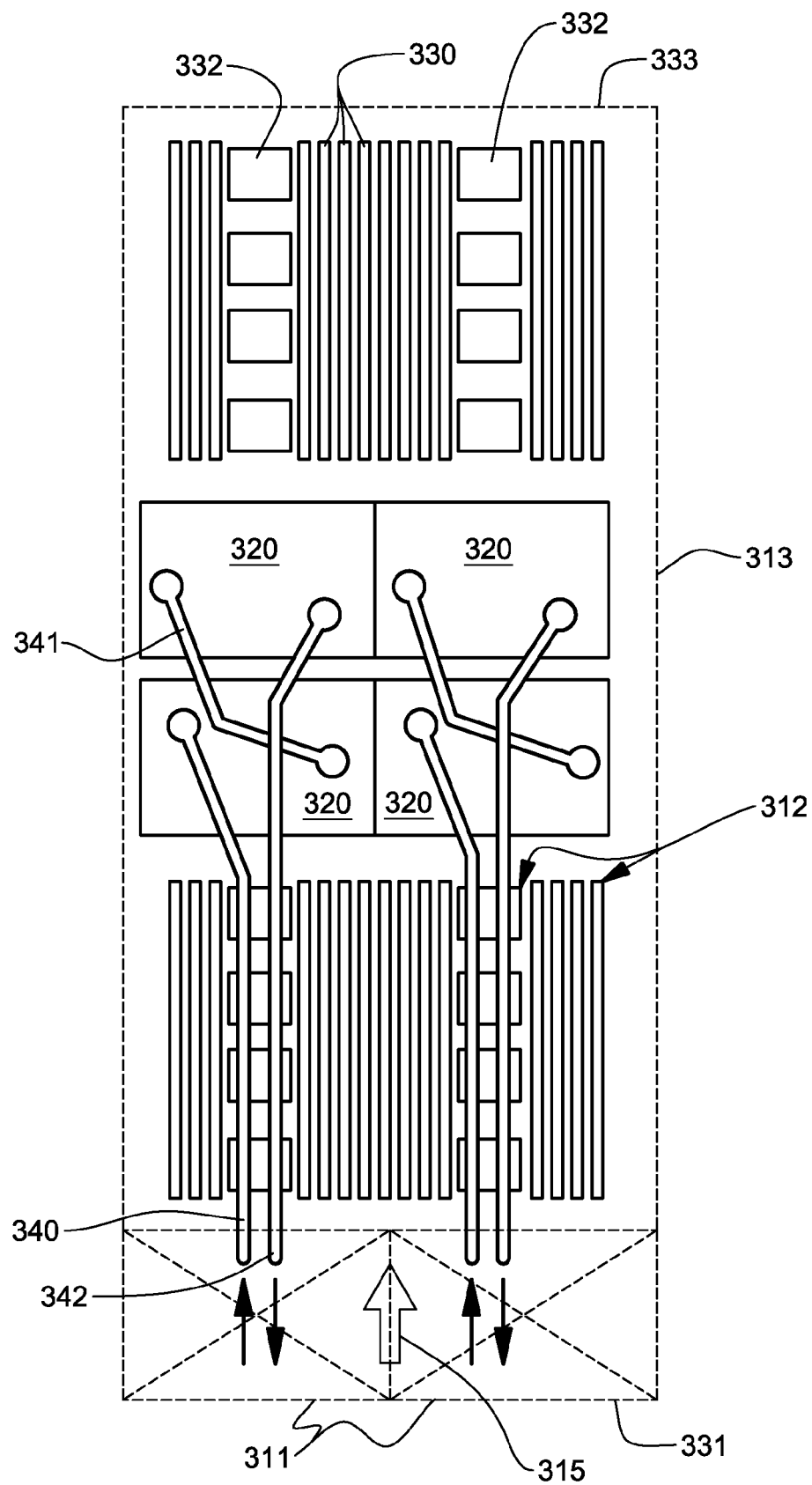
FIG. 3 is a plan view of one embodiment of an electronics subsystem layout illustrating an air and liquid cooling system for cooling components of the electronic subsystem, in accordance with an aspect of the present invention.
Figure 4:
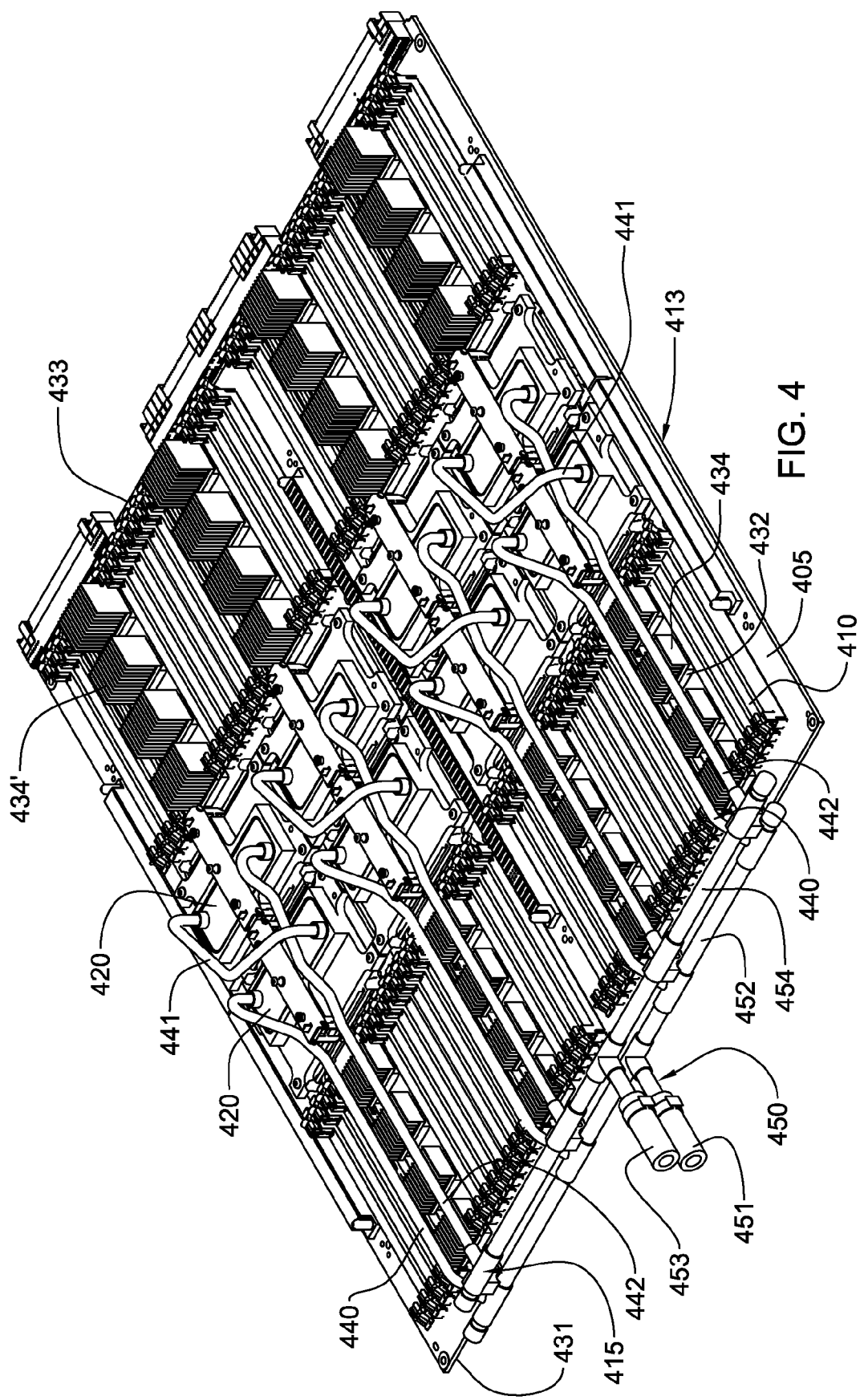
FIG. 4 depicts one detailed embodiment of a partially assembled electronics subsystem layout, wherein the electronics subsystem includes eight heat-generating electronic devices to be cooled, each having a respective cooling apparatus associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 110, via lines 223 and couplings 221. Each electronics rack includes (in one example) a power/control unit 230 for the electronics rack, multiple electronics subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronics subsystems (more particularly, to liquid-cooled cold plates thereof) via flexible hose connections 251, which are disposed between the supply manifold and the respective electronics subsystems within the rack. Similarly, system coolant return manifold 260 is coupled to the electronics subsystems via flexible hose connections 261. Quick connect couplings may be employed at the interface between flexible hoses 251, 261 and the individual electronics subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronics subsystem 313 component layout wherein one or more air moving devices 311 provide forced air flow 315 to cool multiple components 312 within electronics subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronics subsystem 313, and partially arrayed near back 333 of electronics subsystem 313. Also, in the embodiment of FIG. 3, memory modules 330 and the memory support modules 332 are cooled by air flow 315 across the electronics subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronics subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronics subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronics subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronics subsystem 413 are shorter in height than the air-cooled heat sinks 434' coupled to memory support modules 432 near back 433 of electronics subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

Figure 5:
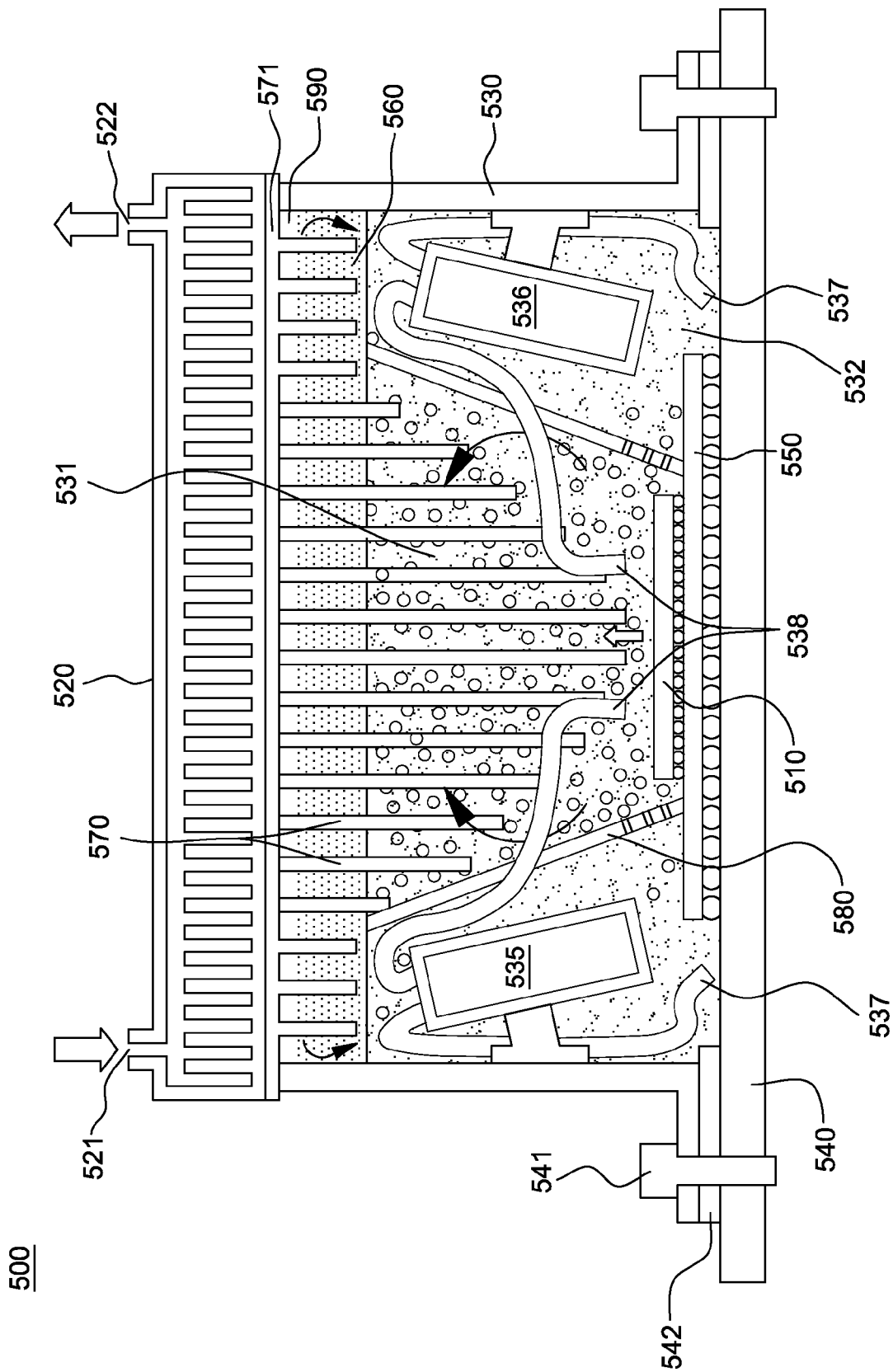
FIG. 5 is a cross-sectional elevational view of one embodiment of a cooled electronic module, in accordance with an aspect of the present invention.

FIG. 5 depicts one embodiment of a pump-enhanced, immersion cooled electronic module 500, which is a structural and thermal interface between a heat-generating electronic device 510, such as a processor or other integrated circuit die, and a liquid-cooled cold plate 520, such as the above-described liquid-cooled cold plate 420 of the electronics subsystem of FIG. 4. Cooled electronic module 500 includes a module casing 530 which forms part of a housing, configured to at least partially surround and form a sealed, fluid-tight compartment 531 about electronic device 510 to be cooled. As shown, dielectric coolant 532 is disposed within sealed compartment 531, as are two impingement-cooling, immersed pumps 535, 536. Each impingement-cooling, immersed pump 535, 536 includes an inlet pump tube 537 disposed with an inlet in a lower portion of the sealed compartment for drawing liquid dielectric fluid into the pump, and a respective pump jet nozzle 538 for directing pressurized dielectric fluid towards the electronic device to be cooled to facilitate the cooling thereof By way of specific example, the impingement-cooling, immersed pumps may each be an LPD-125 liquid pump offered by AdaptivEnergy, LLC, of Hampton, Va., USA.

The housing is a shell-like component that is attached to, for example, a printed circuit board 540 using bolts or screws 541 and a sealing gasket (or o-ring) 542, which is compressed between a lower surface of the housing and an upper surface of the board, or alternatively, between a lower surface of the housing and an upper surface of a substrate 550 to which the electronic device 510 directly couples. As shown, multiple electrical connections, such as C4 connections, electrically couple the electronic device to substrate 550, which in this embodiment is itself electrically coupled via another set of electrical connections to printed circuit board 540.

As used herein, the word "substrate" refers to any underlying supporting structure, such as substrate 550 or printed circuit board 540 to which the electronic device is coupled, and to which the housing may be sealed in order to form sealed compartment 531 about the electronic device. Sealing gasket 542 seals off the inner compartment of the housing and assists in retaining the dielectric fluid within the sealed compartment. The two impingement-cooling, immersed pumps 535, 536 are, in this embodiment, coupled to opposing side walls of the housing, and are positioned, sized and configured to force pressurized dielectric coolant towards the heat-generating electronic device to be cooled, such as a back surface of the heat-generating electronic device. This is accomplished (in one embodiment) via dual, freestanding jet nozzles 538 positioned directly over the back surface of the electronic device to be cooled. When in operation, as dielectric fluid absorbs heat, it undergoes phase change from liquid phase to vapor phase, and thus utilizes its latent heat vaporization for cooling purposes. The resultant dielectric fluid vapor rises to the upper portion of the sealed compartment and forms a dielectric vapor layer 560 in the upper portion of the sealed compartment. Vapor rises since it possesses a significantly lower density compared with the surrounding dielectric liquid. A submerged baffle (or vapor barrier) 580 facilitates directing dielectric fluid vapor upwards to the upper portion of the sealed compartment. At the upper most portion of the sealed compartment, there is illustrated a thin, non-condensable gas layer 590 comprising gases, such as air, which have also left the liquid and travel upwards. These gases can reside in solution within the dielectric fluid, but once out-gassed through the boiling process, cannot be returned to solution via a coolant condensation process.

As depicted, cooled electronic module 500 further comprises a plurality of condenser fins 570 extending into the sealed compartment from a top wall 571 of the housing. In one embodiment, these condenser fins are appropriately sized for the anticipated dielectric vapor layer 560 to form in the upper portion of the sealed compartment with operation of the heat-generating electronic device. Upon reaching the upper portion of the sealed compartment, the dielectric fluid vapor contacts the cool surfaces of the condenser fins, which are cooled, for example, by means of a thermal conduction coupling to liquid-cooled cold plate 520, and more particularly, to system coolant passing via inlet 521 and outlet 522 through the liquid-cooled cold plate. By making contact with the cool, vertically-oriented condenser fin surfaces, the dielectric fluid vapor undergoes a second phase change process from vapor to liquid state, and the liquid droplets fall back downward due to gravity and their relatively higher density compared with the neighboring vapor region. By way of example, the vertically-oriented condenser fins might comprise pin fin or plate fin structures. In the embodiment illustrated in FIG. 5, the vertical length of condenser fins 570 varies, with the more centrally-disposed condenser fins being longer than the perimeter condenser fins. This configuration provides numerous advantages. For example, an increased condensation heat transfer area is provided by the longer fins, and the condensate may be sub-cooled to boost the boiling heat transfer. In addition, the amount of vapor collection in the upper portion of the module is reduced to the extent that the submerged bubbles condense before reaching the upper portion. This configuration also provides an enhanced use of the available rectangular module volume for facilitating the cooling process.

Dielectric liquid in the lower portion of the sealed compartment is simultaneously being drawn into the low pressure side of the immersed pumps 535, 536 via the inlet pump tubing 537. Note that the submerged baffle is configured to function to partially isolate the vapor rich region near the electronic device from the liquid (condensate) rich region near the pump inlet tube openings. The baffle 580 may include openings in its lower portion to allow the dielectric fluid to find its own common level within the sealed compartment. As long as the boiling and condensation cooling processes are in equilibrium and are commensurate with heat generated by the electronic device to be cooled, the electronic module will successfully transport heat from the electronic device to the cold plate.

The coolant employed within the dielectric module is a dielectric fluid so as not to cause a short circuit of electrical current on the various exposed parts of the electronic device and substrate. Many dielectric fluids are commercially available and may be used in the cooled electronic module configuration described herein. Examples include the Novec fluids, manufactured by 3M Corporation (e.g., FC-72, FC-86, HFE-7000 and HFE-7200). Those skilled in the art should note that in addition to the cooling taking place from the electronic device due to the impinging dielectric fluid, there is also heat transfer occurring from the substrate and any other component within the enclosure which generates heat. It should also be noted that the cooled electronic module embodiment of FIG. 5 employs two immersed pumps for redundancy, in the event of a single pump failure. Other configurations may employ only one pump, or even more than two pumps if desired Further details and variations on a pump-enhanced, immersion-cooled electronic module such as depicted in FIG. 5 are disclosed in co-filed U.S. patent application Ser. No. 12/491,286, entitled "Condenser Fin Structures Facilitating Vapor Condensation Cooling of Coolant", and co-filed U.S. patent application Ser. No. 12/491,287, entitled "Condenser Structures with Fin Cavities Facilitating Vapor Condensation Cooling of Coolant", and co-filed U.S. patent application Ser. No. 12/491,289, entitled "Direct Jet Impingement-Assisted Thermosyphon Cooling Apparatus and Method", and U.S. patent application Ser. No. 12/491,293, entitled "Condenser Block Structures with Cavities Facilitating Vapor Condensation Cooling of Coolant", the entirety of each of which is hereby incorporated herein by reference.

Figure 6B:
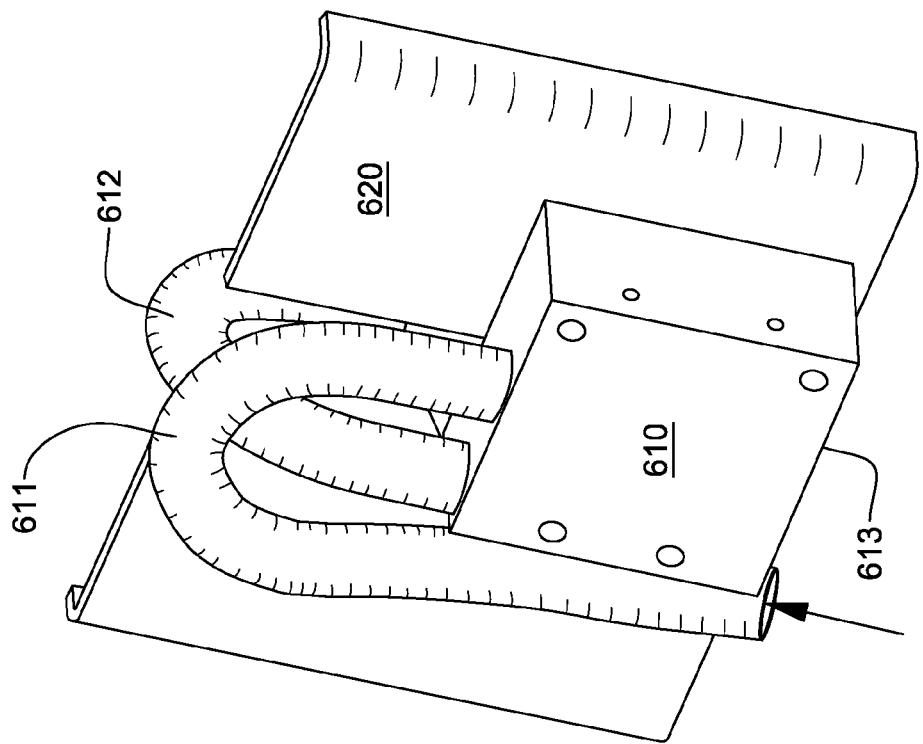
FIGS. 6A & 6B are perspective views of one embodiment of an impingement-cooling, immersed pump for a cooled electronic module, in accordance with an aspect of the present invention.
Figure 6A:
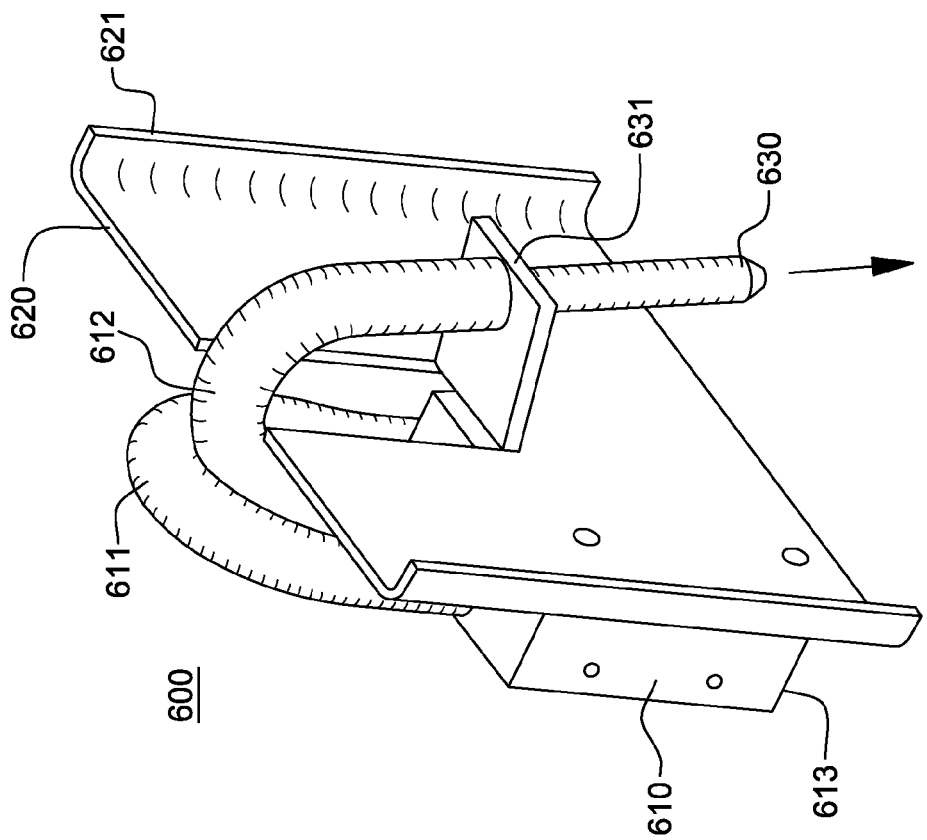

FIGS. 6A & 6B depict one embodiment of a pump subassembly 600, which includes a submersible miniature pump 610 attached to a pump support structure 620. The submersible miniature pump, which represents one embodiment of the impingement-cooling, immersed pump 535, 536 depicted in FIG. 5, includes a pump inlet tube 611 and a pump outlet tube 612 connected as shown to a pump housing 613. In this embodiment, a jet nozzle 630 is integrated via a nozzle support pedestal 631 with pump support structure 620. The pump support structure 620 further includes folded sides 621 which facilitate press fitting of the pump support structure in position within the housing of the cooling apparatus. Alternatively, the support structure could be attached via bolting, soldering, brazing, welding, gluing, etc., to the housing.

FIGS. 6A & 6B show perspective views from two different angles to highlight the pump structure side and the support structure side, respectively. The arrow in FIG. 6A depicts dielectric fluid exiting the nozzle at high pressure to impinge on, for example, a back surface of the electronic device to be cooled. The arrow in FIG. 6B depicts the condensed dielectric liquid entering the pump suction side via the pump inlet tube 611. Also shown in these figures are the various attachment points that are used, in one embodiment, to attach the pump housing to the support structure, and the pedestal that is integrated with the support structure and attached to (or integrated with) jet nozzle 630 on the one side and to pump outlet tubing 612 on the other side.

Figure 7B:
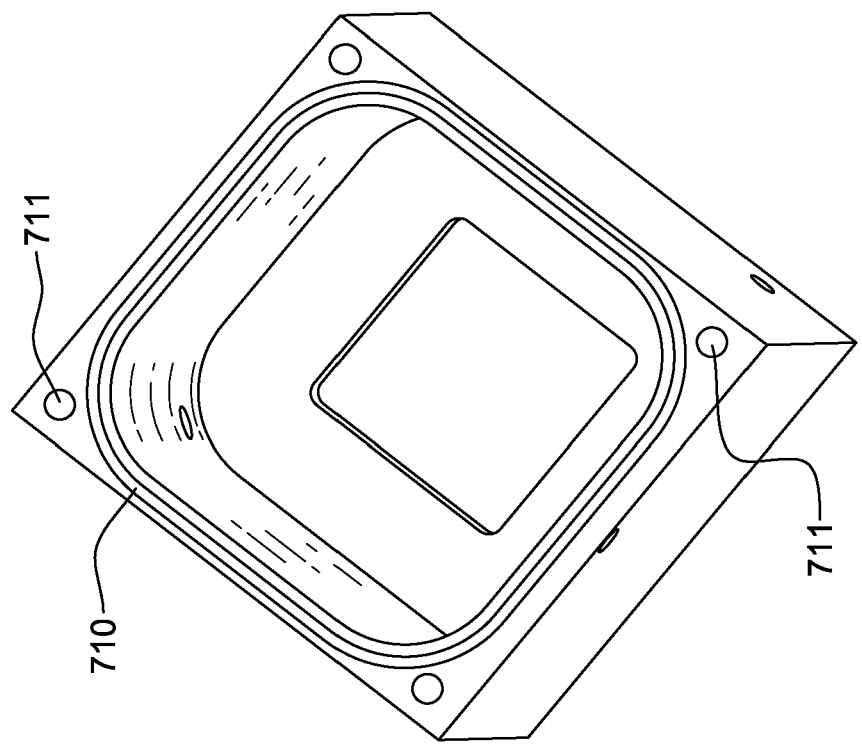
FIGS. 7A & 7B are perspective views of one embodiment of a module casing portion of a housing configured to at least partially surround and form a sealed compartment about an electronic device to be cooled, in accordance with an aspect of the present invention.
Figure 7A:
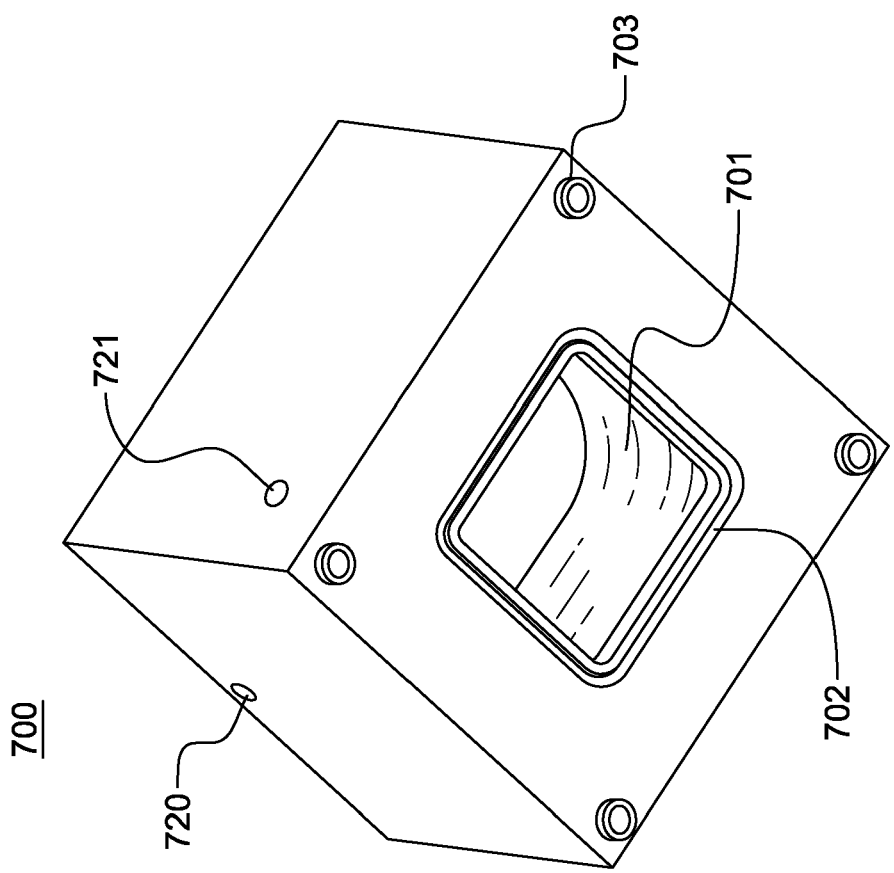

FIGS. 7A & 7B depict one embodiment of a module casing 700 portion of a housing, in accordance with an aspect of the present invention. In addition to module casing 700, the housing of the cooled electronic module includes a top wall, which seals across the larger rectangular opening in module casing 700. As shown in FIGS. 7A & 7B, a smaller opening 701 is provided sized to accommodate the electronic device to be cooled, so that the electronic device resides within the sealed compartment (as described above). A grooved recess 702 is provided positioned and sized to receive an o-ring (see FIG. 9A) to seal the housing to a substrate supporting the electronic device to be cooled. Standoffs 703 are disposed at the corners of module casing 700 to ensure a predetermined crush depth of the o-ring when positioned between the housing and the substrate. As shown in FIG. 7B, a recess 710 is also provided for a top sealing o-ring (see FIG. 9A) to ensure a fluid-tight joint between the module casing and top wall (FIGS. 8A & 8B) of the housing. Holes 711 extend through the module casing to facilitate attachment of the housing to, for example, the substrate supporting the heat-generating electronic device to be cooled. Also shown in FIG. 7A is a hole (or port) 720 which allows filling (and draining) of the sealed compartment with dielectric fluid, as well as a hole (or port) 721 sized for a fluid-tight, electrical feed through for wires to power and control the pumps within the sealed compartment. As noted, the smaller rectangular recess or opening accommodates the electronic device for insertion into the sealed compartment, while the larger rectangular recess is sized to receive the top wall condenser plate with condenser fins extending into the sealed compartments.

Figure 8B:
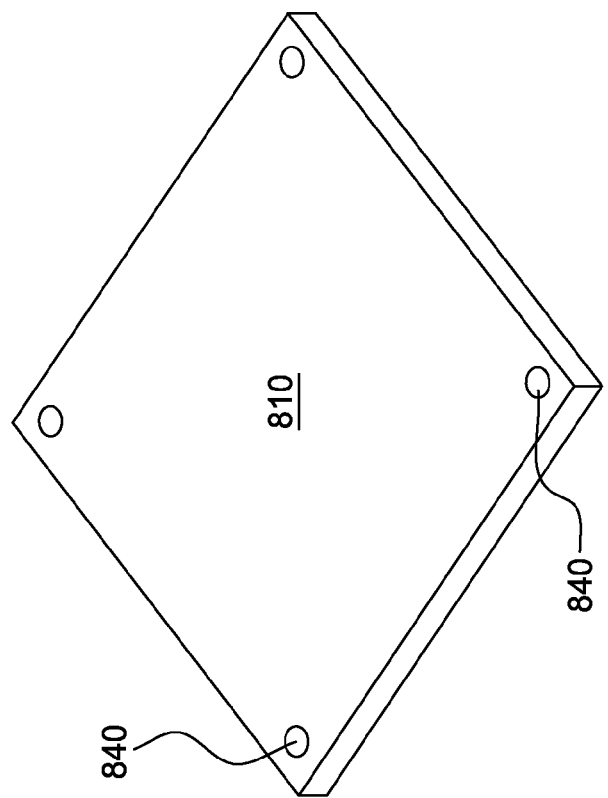
FIGS. 8A & 8B are perspective views of one embodiment of a top wall portion of the housing of FIG. 5, in accordance with an aspect of the present invention.
Figure 8A:
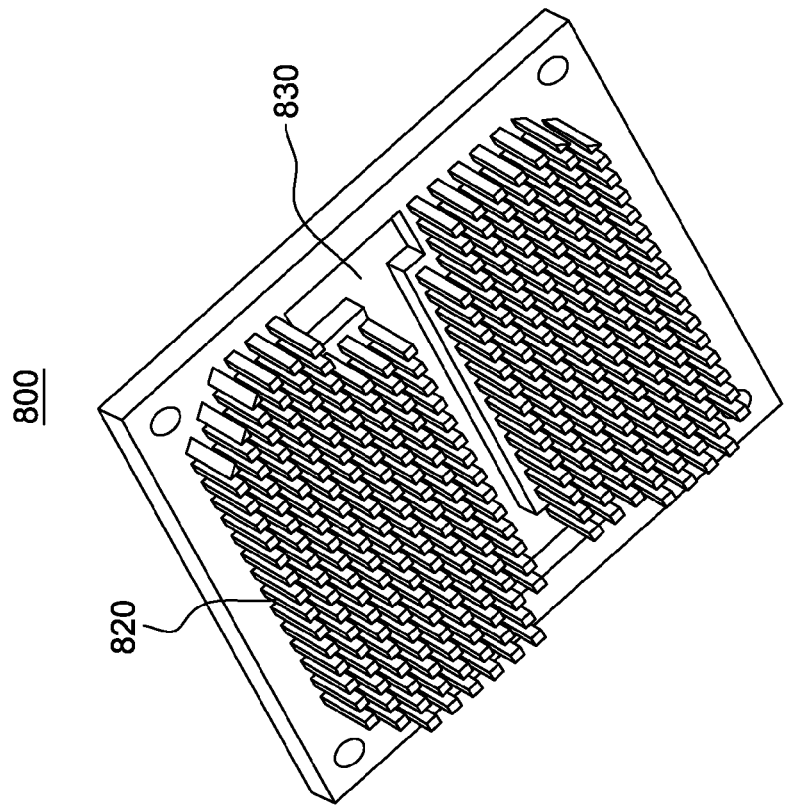

FIGS. 8A & 8B depict one embodiment of a top wall condenser structure 800 configured to facilitate cooling of dielectric fluid vapor in the upper portion of the sealed compartment. As illustrated, the condenser structure includes a plate or top wall 810 having an upper surface to which a liquid-cooled cold plate or air-cooled heat sink may be attached. The bottom surface of top wall 810 includes a plurality of square-shaped, vertically-oriented pin fins, or more generally, condenser fins 820. One or more recesses 830 are provided in the bottom surface of top wall 810 to accommodate the above-described pump tubing, in one embodiment. Corner holes 840 facilitate attachment of the assembled housing (comprising the top wall and the module casing) to the substrate supporting the electronic device to be cooled. Note that the condenser fins may take any desired shape, with the square-shaped pin fins depicted providing enhanced surface area for heat transfer.

Figure 9B:
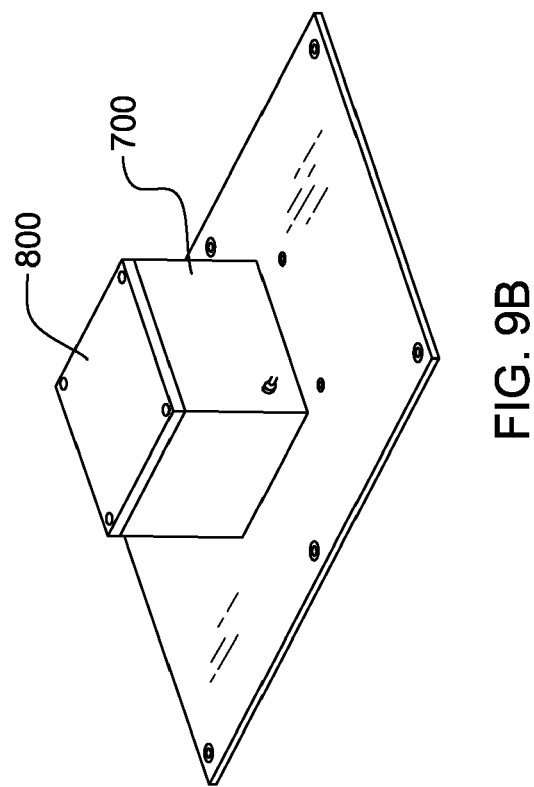
FIG. 9B is a perspective view of the assembled cooled electronic module of FIG. 9A, in accordance with an aspect of the present invention.
Figure 9A:
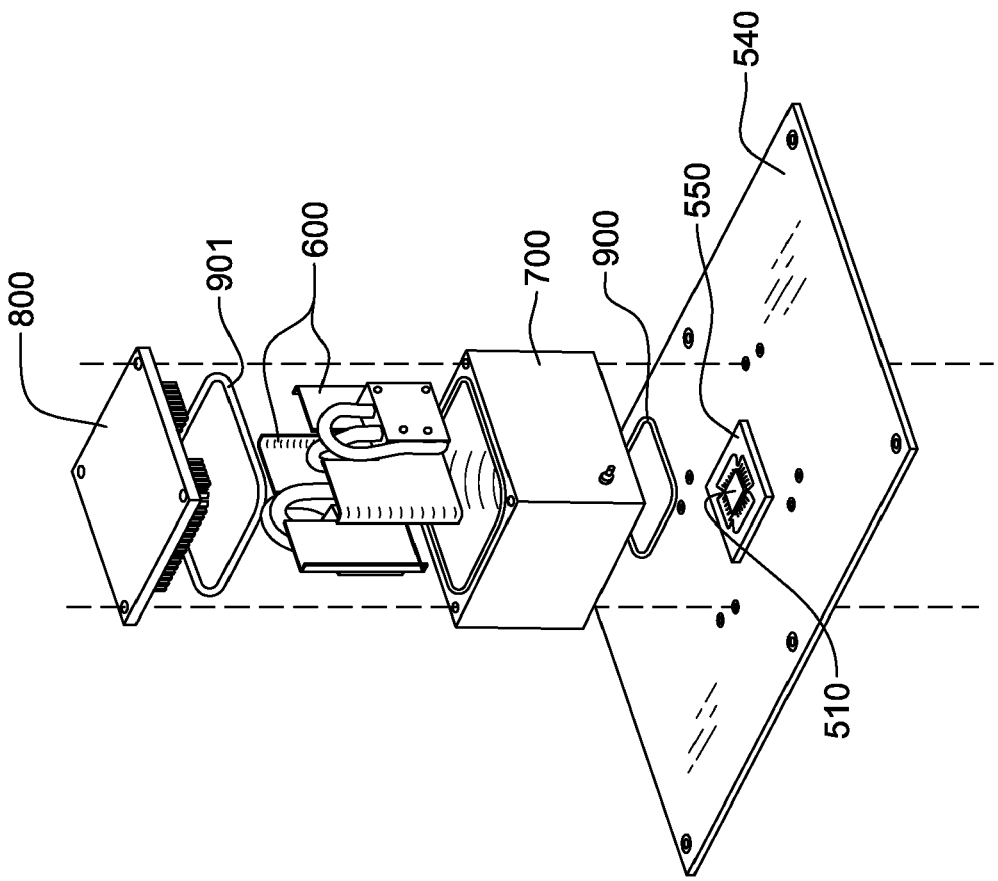
FIG. 9A is a partially exploded perspective view of one embodiment of a cooled electronic module, in accordance with an aspect of the present invention.

FIGS. 9A & 9B depict exploded, and assembled perspective views, respectively, of one embodiment of a cooled electronic module, in accordance with an aspect of the present invention. As illustrated, the cooled electronic module mounts (in one embodiment) to a board 540, which includes a substrate 550 electrically and mechanically coupled thereto, upon which an electronic device, such as an integrated circuit die 510, resides. A first o-ring 900 resides between substrate 550 and module casing 700. As shown, an inner chamber is defined within module casing 700 sized to accommodate two pump sub-assemblies 600, such as described above. A second o-ring 901 facilitates sealing of a top wall condenser structure 800 to module casing 700, as illustrated in FIG. 9B.

Figure 10:
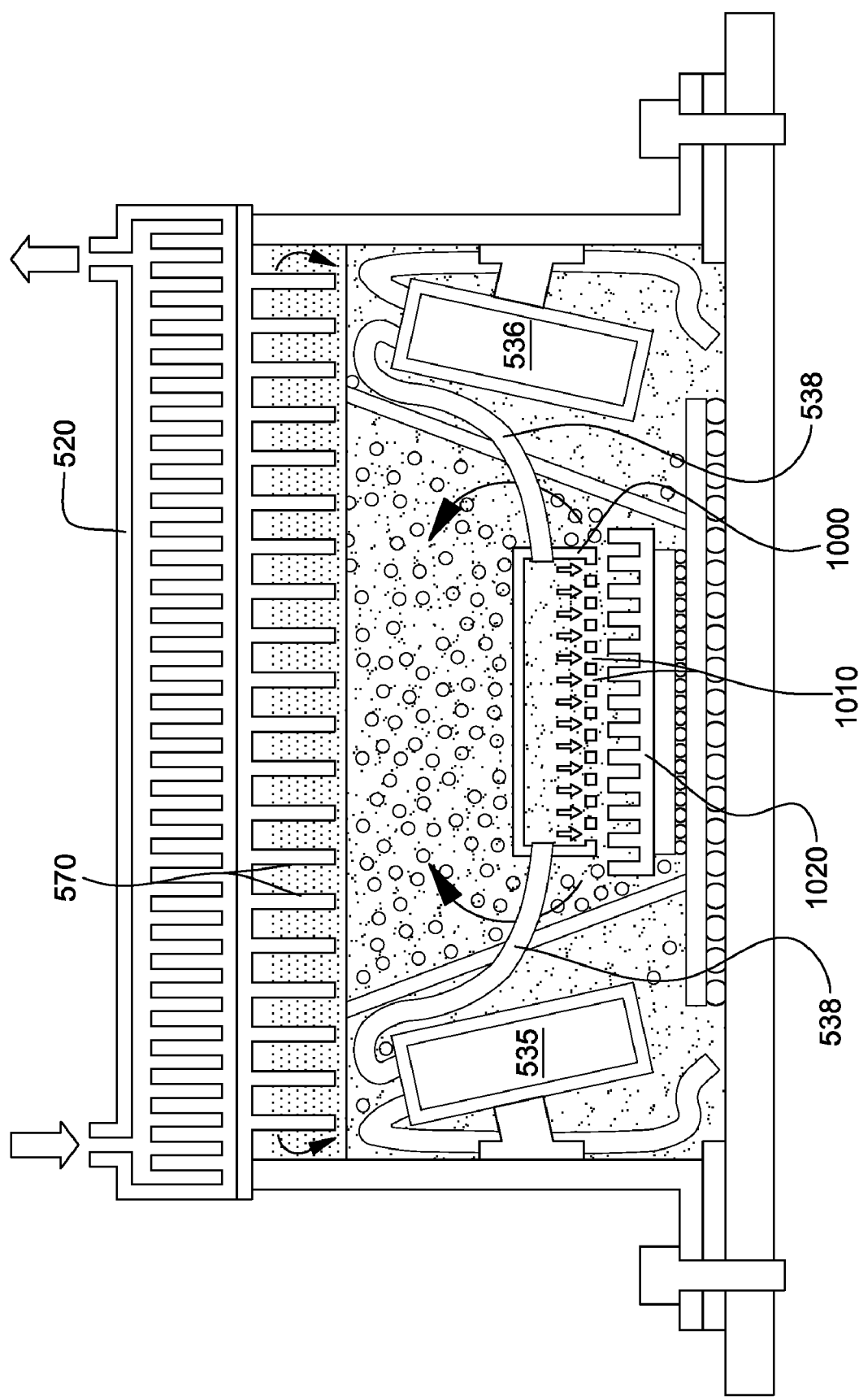
FIG. 10 is a cross-sectional elevational view of an alternate embodiment of a cooled electronic module, in accordance with an aspect of the present invention.
Figure 11:
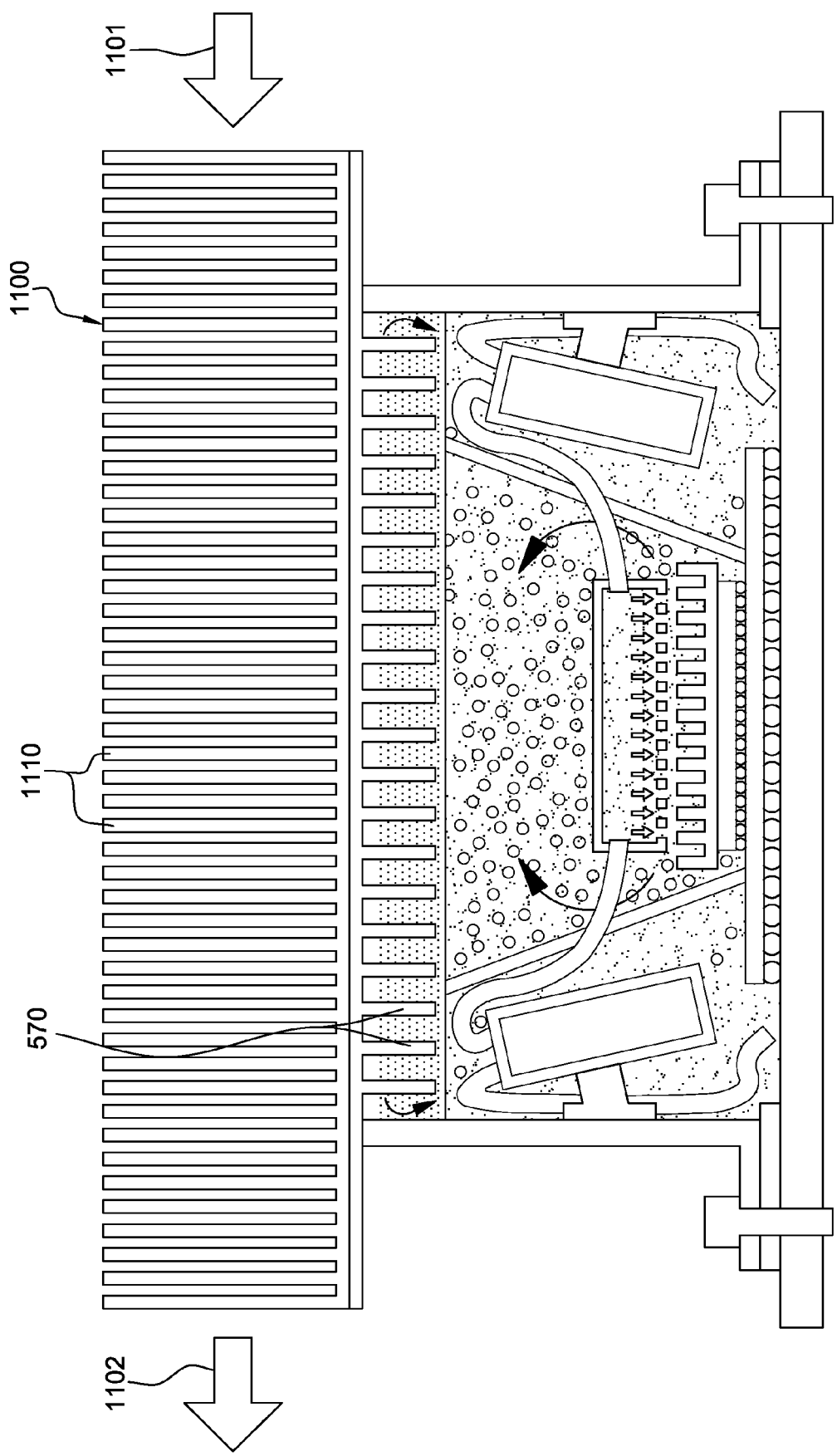
FIG. 11 is a cross-sectional elevational view of another alternate embodiment of a cooled electronic module, in accordance with an aspect of the present invention.

FIG. 10 depicts a modified version of the cooled electronic module of FIG. 5. In this embodiment, a manifold structure 1000 is positioned within the sealed compartment over the electronic device to be cooled. Manifold structure 1000 functions as a submerged jet impingement plenum and includes jet orifices 1010 for jet impingement of dielectric fluid onto a boiling heat sink 1020, which is thermally coupled to the electronic device. The pump sub-assemblies are modified such that the pump outlet tubes 538 feed dielectric fluid into manifold structure 1000 under pressure. The dielectric fluid is then forced through the plurality of jet orifices 1010 as dielectric fluid jets that strike the fluid boiling heat sink structure. The result is a removal of heat via a two-phase convective heat transfer. As the dielectric liquid absorbs heat, it undergoes phase change from the liquid phase to the vapor phase, and thus utilizes its latent heat of vaporization for cooling purposes. As in the embodiment described above, the vapor generated rises to the upper portion of the sealed compartment where it encounters the cool surfaces of the condenser fins 570. In the embodiment of FIG. 10, condenser fins 570 are cooled by a liquid-cooled cold plate 520, such as a water-cooled cold plate, while in the embodiment of FIG. 11, condenser fins 570 are cooled by an air-cooled heat sink 1100. As illustrated in FIG. 11, air-cooled heat sink 1100 includes a plurality of upwardly-projecting fins 1110 through which ingressing air 1101 passes, and egresses as heated air 1102.

Figure 12:
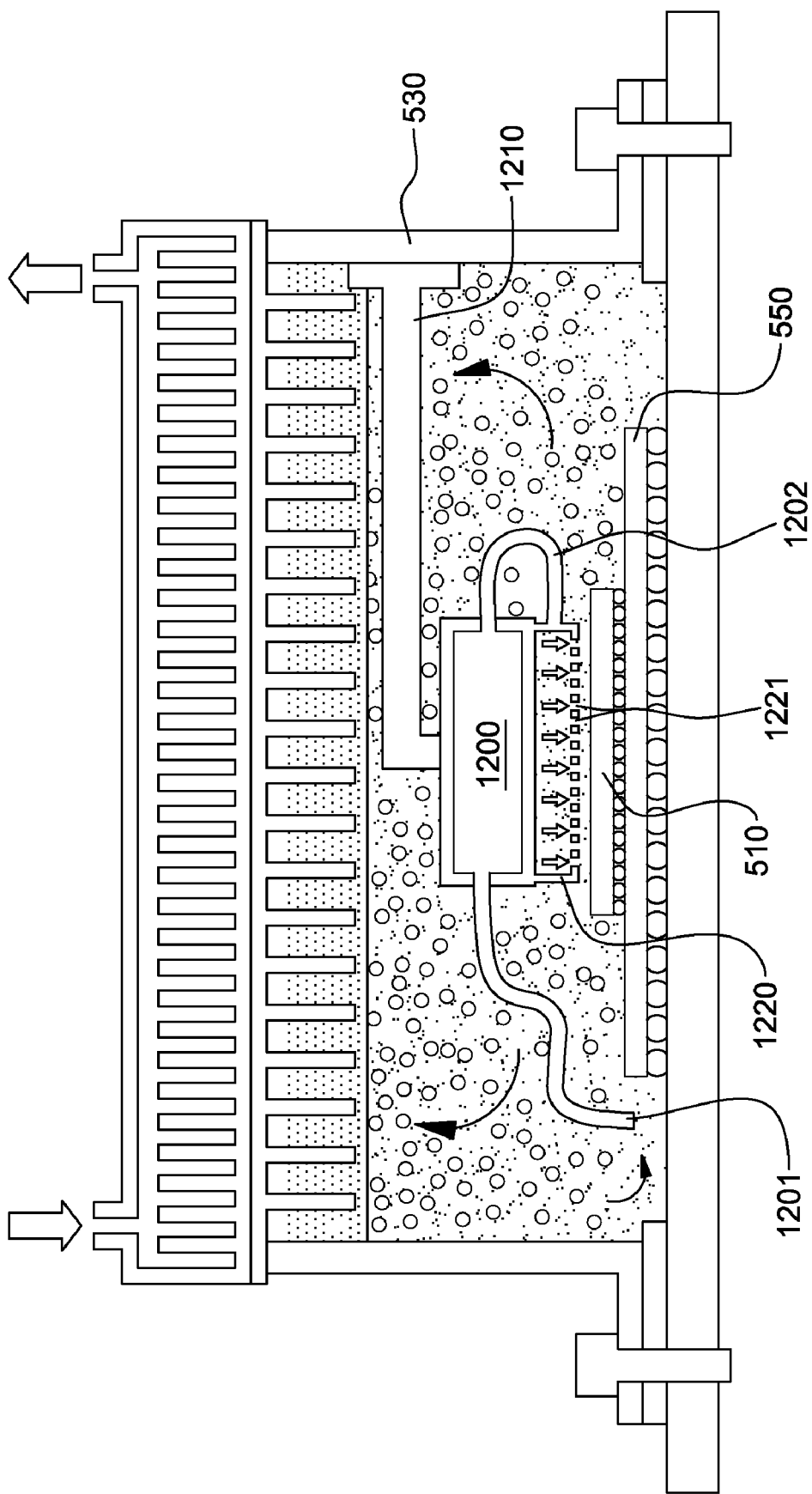
FIG. 12 is a cross-sectional elevational view of an alternate embodiment of a cooled electronic module, in accordance with an aspect of the present invention.

FIG. 12 depicts a further variation of the cooled electronic module structures of FIGS. 5, 10 & 11, wherein a single, horizontally-disposed, impingement-cooling, immersed pump 1200 is employed, which allows the cooled electronic module to utilize significantly less vertical height, thereby making it more compact from a server-packaging standpoint for low profile server nodes. The single immersed pump 1200 is shown oriented horizontally within the sealed compartment, and attached at one side via a pump attachment bracket 1210 to an inner wall of the module casing 530. A pump inlet tube 1201 is positioned with an inlet opening in a lower portion of the sealed compartment to draw in dielectric liquid, and a pump outlet tube 1202 is coupled to a jet impingement manifold 1220 shown integral with the single immersed pump 1200. The high pressure side of the immersed pump discharges dielectric liquid into the jet impingement manifold, from which the liquid is output through jet orifices 1221 to impinge upon, in this embodiment, a back surface of electronic device 510 to be cooled. Note that by horizontally disposing immersed pump 1200, and integrating the pump with the jet impingement manifold 1220, a compact design is obtained. Additionally, the horizontal pump orientation means that the head loss related to the suction and discharge tubing is lower compared to the embodiments described in connection with FIGS. 5, 10 & 11.

FIGS. 13-16B depict additional variations on a cooled electronic module, in accordance with an aspect of the present invention. As illustrated, in each of these embodiments, the electronic device comprises a stack of integrated circuit chips.

Figure 13:
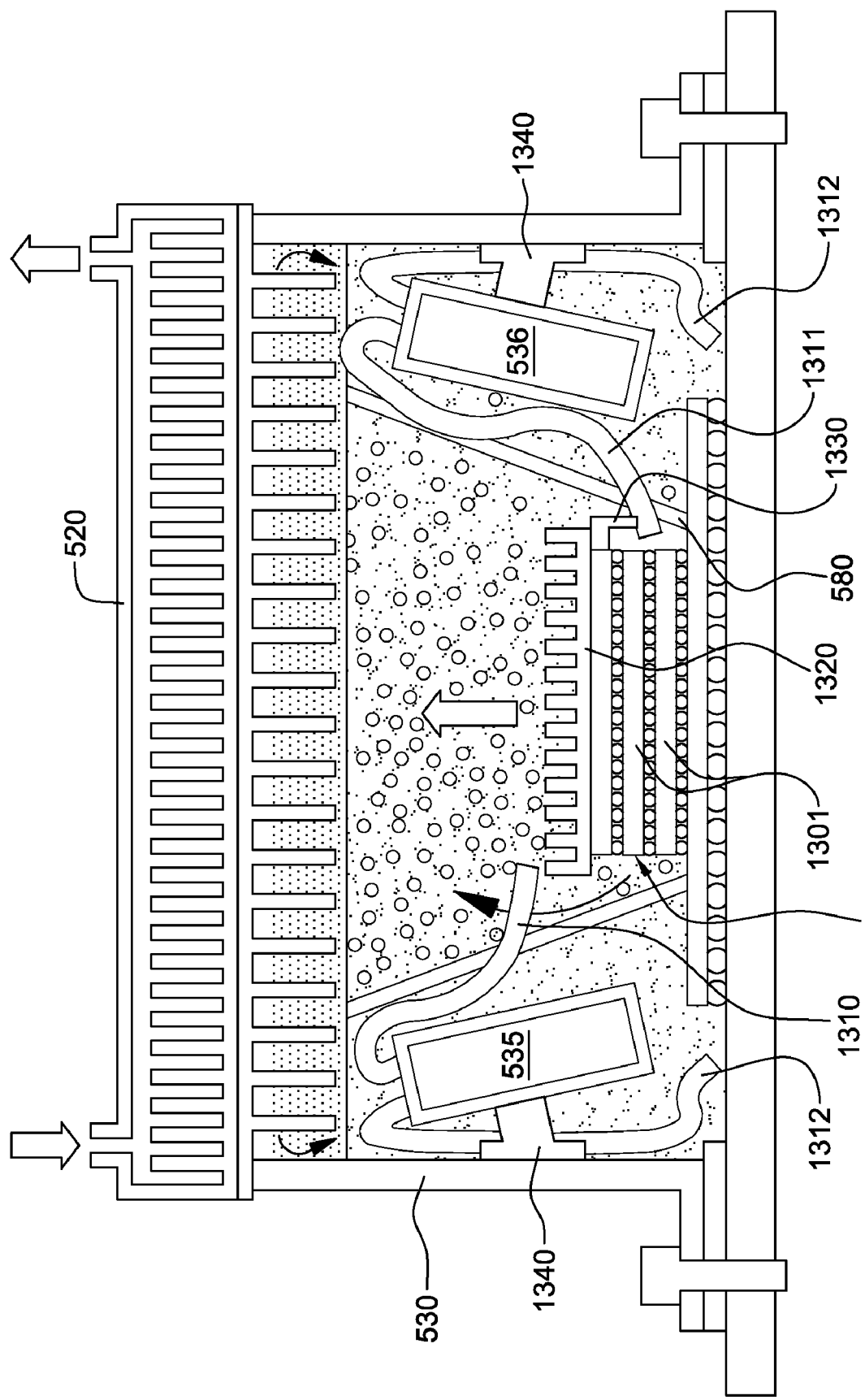
FIG. 13 is a cross-sectional elevational view of an alternate embodiment of a cooled electronic module, wherein the electronic device to be cooled comprises a stack of integrated circuit chips, in accordance with an aspect of the present invention.

Referring first to FIG. 13, an embodiment of a pump-enhanced, immersion cooled electronic module is depicted which is configured as a structural and thermal interface between an electronic device comprising a stack 1300 of integrated circuit chips 1301, and liquid-cooled cold plate 520. Unless otherwise described, the cooled electronic module of FIG. 13 is similar to that described above, for example, in connection with FIG. 5.

The structural differences include, in addition to provision of a stack of integrated circuit chips, use of a fluid boiling heat sink 1320 thermally coupled to a top surface of the stack of integrated circuit chips, and a manifold structure 1330, which with submerged baffle 580 forms an inlet manifold in fluid communication with a pump outlet tube 1311 of immersed pump 536. Dielectric fluid flow from pump outlet tube 1311 flows through this inlet plenum into the interstitial spaces between integrated circuit chips 1301 before exiting out of, for example, an opposing side of the stack of the integrated circuit chips, as illustrated by the arrow depicting upward flow of dielectric fluid and dielectric fluid vapor from the stack of integrated circuit chips.

Immersed pump 535 includes a pump outlet tube 1310 which is positioned to direct a flow of dielectric fluid onto fluid boiling heat sink 1320 for cooling the stack of integrated circuit chips through, in part, boiling of the dielectric fluid as described above. Immersed pumps 535, 536 each include an inlet pump tube 1312 with an inlet in a lower portion of the sealed compartment to drawn in liquid dielectric fluid, and each is mounted via a bracket 1340 to an inner wall of module casing 530 (in this embodiment).

Figure 14:
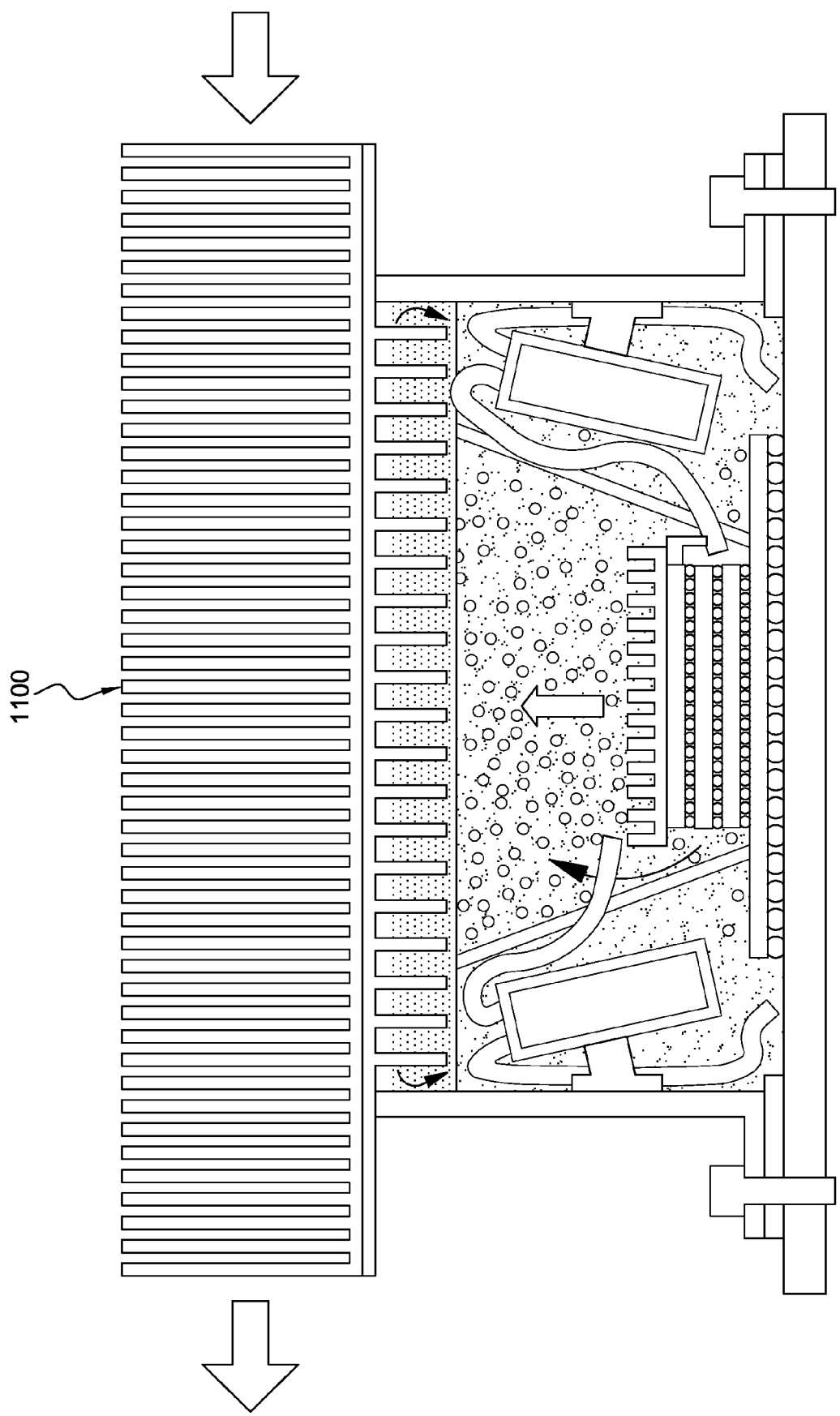
FIG. 14 is a cross-sectional elevational view of another alternate embodiment of a cooled electronic module, wherein the electronic device to be cooled comprises a stack of integrated circuit chips, in accordance with an aspect of the present invention.

FIG. 14 depicts a similar liquid-cooled module embodiment such as described above in connection with FIG. 13, with the exception that the liquid-cooled cold plate 520 of FIG. 13 is replaced by an air-cooled heat sink 1100, such as described above in connection with the embodiment of FIG. 11. In an alternate embodiment, the air-cooled heat sink could be modified to have a footprint corresponding to the footprint of the underlying module casing. Also, the module casing could be modified in its upper portion to flare outward and allow for a condenser section that has an enlarged footprint, for example, similar to the footprint of the air-cooled heat sink illustrated in FIG. 14.

Figure 15A:
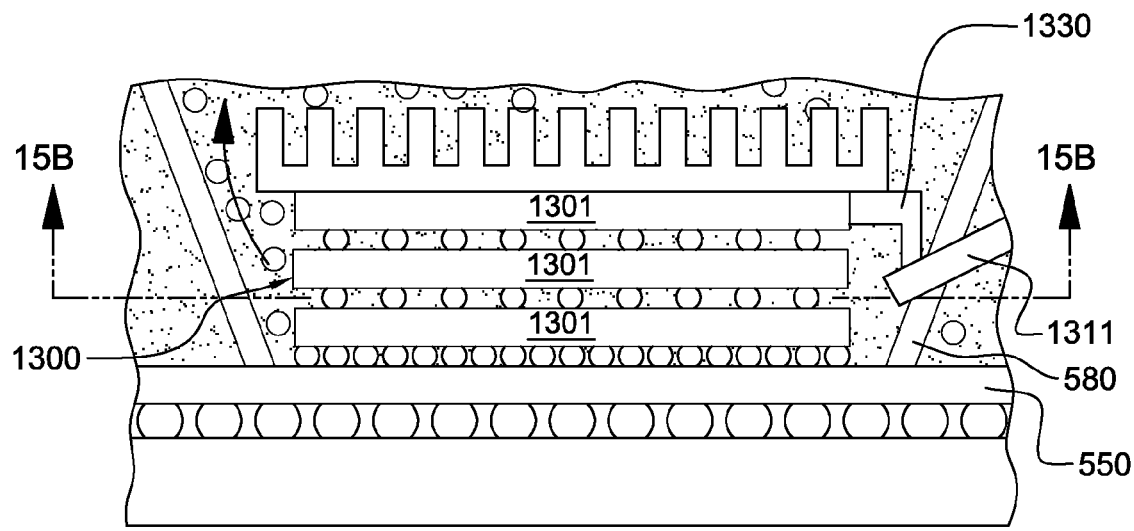
FIG. 15A is a partial cross-sectional elevational view of the cooled electronic module of FIG. 13 or FIG. 14, in accordance with an aspect of the present invention.
Figure 15B:
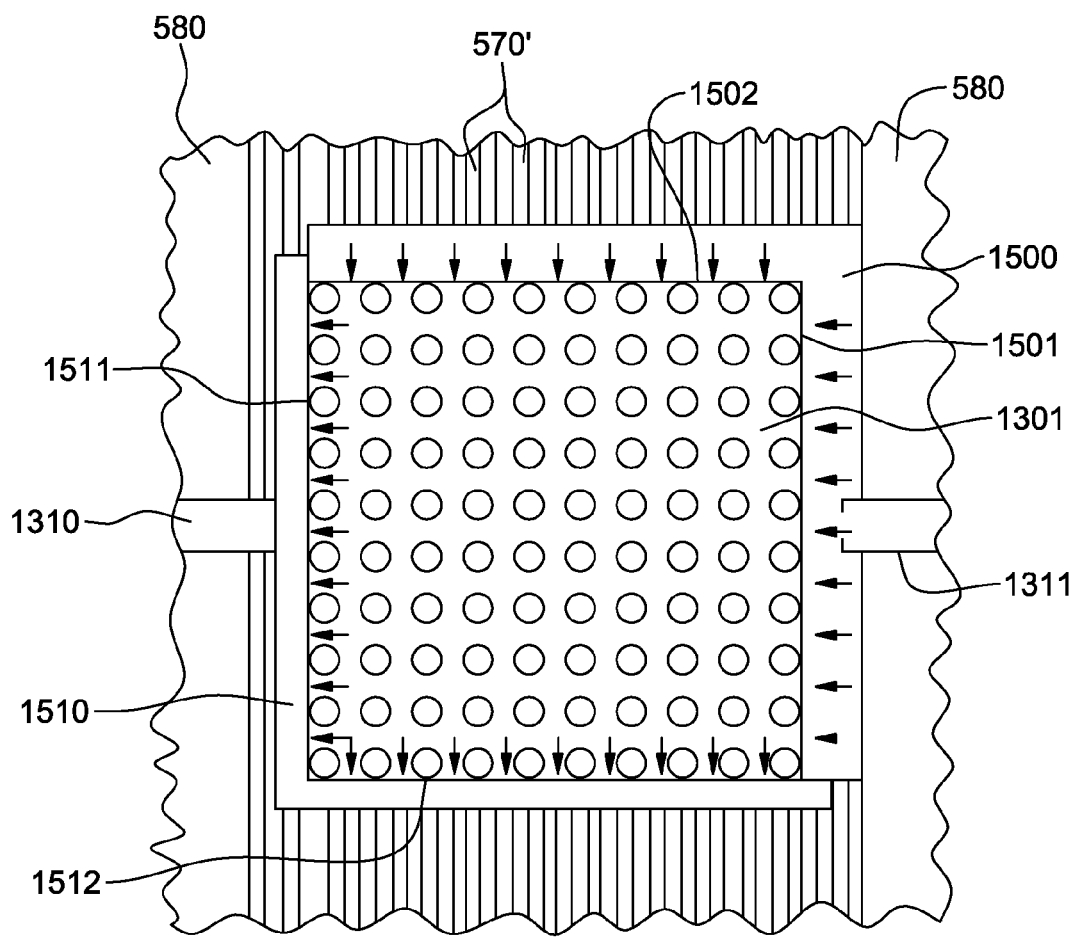
FIG. 15B is a cross-sectional plan view of the cooled electronic module of FIG. 15A, taken along line 15B-15B, in accordance with an aspect of the present invention.

FIGS. 15A & 15B depict further details of the interstitial dielectric fluid delivery approach noted above in connection with FIGS. 13 & 14. In FIG. 15B, arrows indicate the direction of dielectric fluid flow from inlet plenum 1500, encompassing a first side 1501 and a second side 1502 of the stack 1300 of integrated circuit chips 1301, to an outlet plenum 1510 encompassing a third side 1511 and fourth side 1512 of the stack. Dielectric fluid is delivered to inlet plenum 1500 via pump outlet tube 1311, with pump outlet tube 1310 delivering fluid to the fluid boiling heat sink described above. As shown, the inlet plenum is defined via the manifold structure 1330, and a portion of submerged baffle 580, through which outlet pump tubing 1311 passes. Those skilled in the art will note that the interstitial spaces are made of up of the free volume created when integrated circuit chips are stacked one on top of each other, utilizing an array(s) of interconnect structures connecting them electrically. Since the interconnects make up only a fraction of the volume between the chips, there exists open volume which yields fluid passages that can be exploited for cooling the stack of integrated circuit chips. Further, those skilled in the art will note that the outlet plenum 1510 is defined, in one embodiment, by a lower portion of submerged baffle 580, and is open to the upper region of the housing's sealed compartment. Thus, dielectric fluid vapor exiting the interstitial spaces travels freely upwards towards the condenser region of the housing. One embodiment of condenser fins 570' is depicted in FIG. 15B, wherein the condenser fins comprise plate fins depending downward from the top wall of the housing.

Figure 16A:
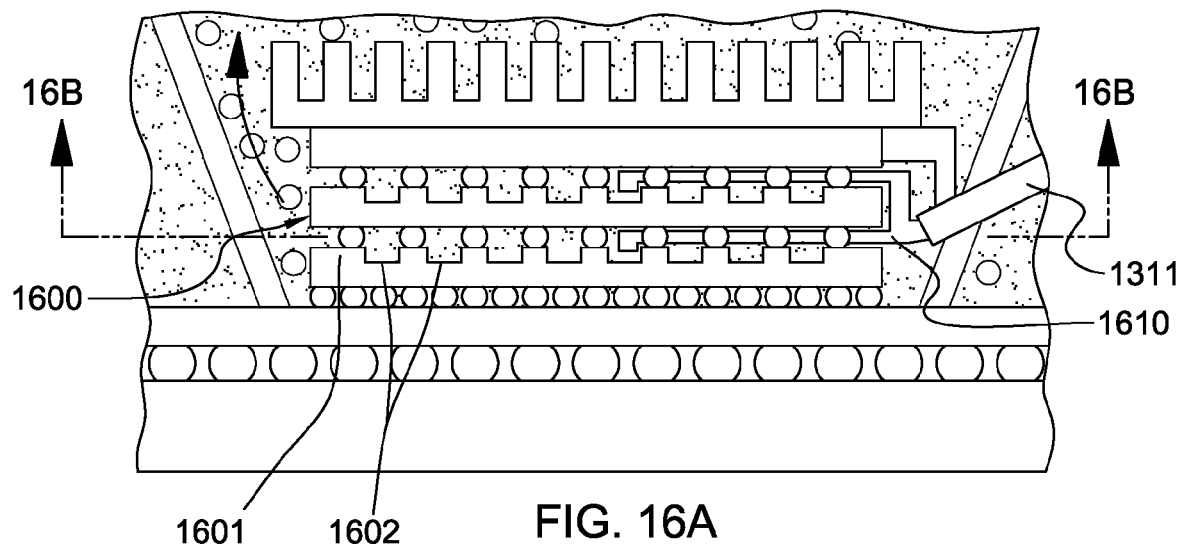
FIG. 16A is a partial cross-sectional elevational view of an alternate embodiment of a cooled electronic module, in accordance with an aspect of the present invention.
Figure 16B:
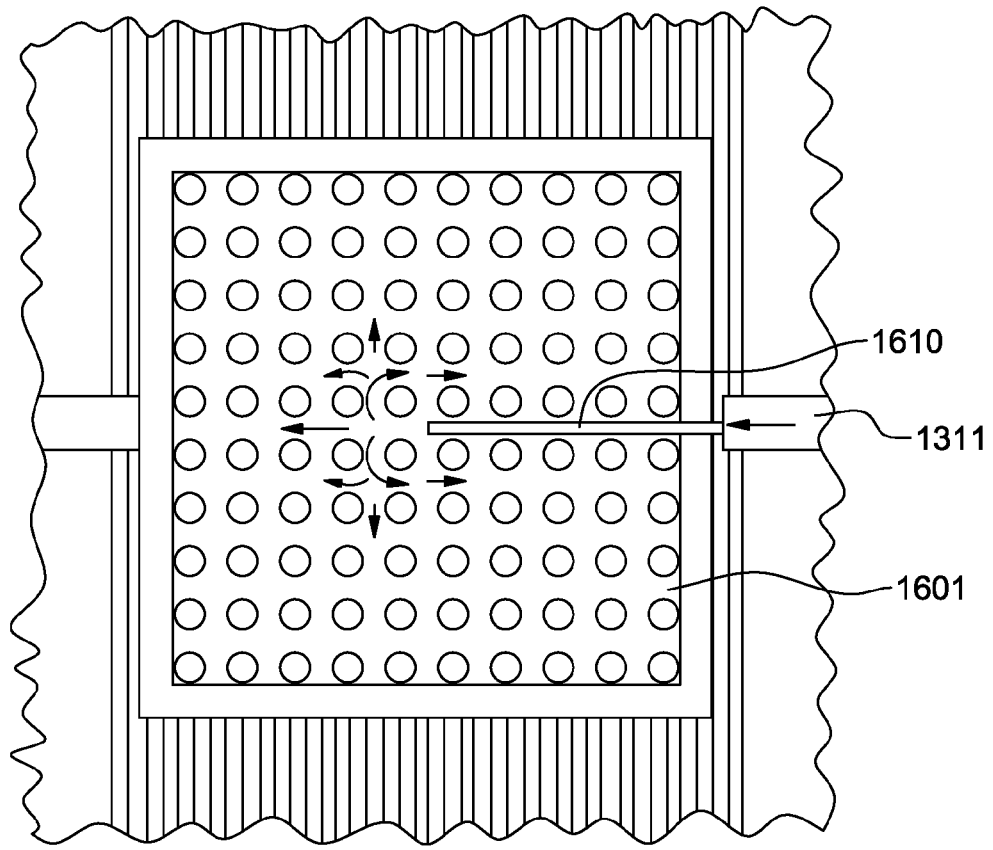
FIG. 16B is a cross-sectional plan view of the cooled electronic module of FIG. 16A, taken along line 16B-16B, in accordance with an aspect of the present invention.

FIGS. 16A & 16B depict a further variation of a cooled electronic module, in accordance with an aspect of the present invention. As illustrated, this cooled electronic module includes a stack 1600 of integrated circuit chips 1601 having a boiling heat sink coupled to an upper surface thereof Also, channels 1602 are cut into the back surface of one or more of the integrated circuit chips in the stack to enhance flow passage of dielectric fluid through the interstitial spaces between adjoining integrated circuit chips. In this embodiment, an embedded nozzle 1610 extends from pump outlet tube 1311 into the interstitial spaces between the integrated circuit chips in the stack. As illustrated in FIG. 16B, one or more embedded nozzles extend to a middle of the interstitial spaces between adjoining chips to deliver under pressure a flow of dielectric fluid into the interstitial spaces. In order to ensure that dielectric fluid disperses substantially evenly in all directions, the embedded nozzles are configured with a right-angle bend at their ends to force the dispensing dielectric fluid liquid 90° to impinge into criss-crossing channels that are notched into the back surface of the adjacent chips in the stack. The channels are positioned to correspond to the free surface areas which are not contacted by any interconnect structure coupling adjacent integrated circuit chips. These channels yield substantially enhanced free volume for coolant flow through the passages between the chips and the stack. The channels defined within the back surfaces of the integrated circuit chips facilitate the outward flow of dielectric fluid to any one of the side edges of the stack from which it is ultimately returned to an upper portion of the sealed compartment, as illustrated by the arrow in FIG. 16A.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising: a housing configured to at least partially surround and form a sealed compartment about an electronic device to be cooled; a dielectric fluid disposed within the sealed compartment, wherein the electronic device to be cooled is at least partially immersed within the dielectric fluid; at least one pump disposed within the sealed compartment for actively pumping the dielectric fluid disposed within the sealed compartment towards the electronic device to be cooled, the at least one pump comprising an impingement-cooling, immersed pump disposed within the sealed compartment, the impingement-cooling, immersed pump actively pumping the dielectric fluid drawn via an inlet from a lower region of the sealed compartment towards the electronic device to be cooled; and an at least partially submerged baffle disposed adjacent to at least one side of the electronic device to be cooled to facilitate directing of dielectric fluid vapor to an upper region of the sealed compartment, and away from the dielectric fluid in the lower region of the sealed compartment being drawn into the impingement-cooling, immersed pump for active pumping via an outlet towards the electronic device to be cooled, wherein the inlet and the outlet of the impingement-cooling, immersed pump are disposed on different sides of the at least partially submerged baffle.

2. The cooling apparatus of claim 1, further comprising a plurality of condenser fins extending into the sealed compartment in the upper region of the sealed compartment, the plurality of condenser fins facilitating cooling of the dielectric fluid vapor rising to the upper region of the sealed compartment.

3. The cooling apparatus of claim 2, wherein the plurality of condenser fins extend from a top wall of the housing downward into the sealed compartment, and wherein the top wall of the housing is coupled to one of a liquid-cooled cold plate or an air-cooled heat sink for cooling the plurality of condenser fins.

4. The cooling apparatus of claim 1, wherein the impingement-cooling, immersed pump is a first impingement-cooling, immersed pump and the cooling apparatus further comprises a second impingement-cooling, immersed pump disposed within the sealed compartment for actively pumping the dielectric fluid towards the electronic device to be cooled, each of the first and second impingement-cooling, immersed pumps actively pumping the dielectric fluid drawn from the lower region of the sealed compartment towards the electronic device to be cooled.

5. The cooling apparatus of claim 1, further comprising a manifold structure disposed within the sealed compartment over the electronic device to be cooled, the manifold structure comprising a submerged jet impingement plenum with jet orifices for directing jets of the dielectric fluid towards the electronic device to be cooled, wherein the at least one pump actively pumps the dielectric fluid under pressure into the submerged jet impingement plenum for delivery through the jet orifices as the jets of the dielectric fluid directed towards the electronic device to be cooled.

6. The cooling apparatus of claim 5, further comprising a fluid boiling heat sink disposed within the sealed compartment and thermally coupled to the electronic device to be cooled, the fluid boiling heat sink being disposed such that the dielectric fluid jets directed from the submerged jet impingement plenum impinge on the fluid boiling heat sink, the fluid boiling heat sink comprising a plurality of pin fins extending away from the electronic device to be cooled which facilitate transfer of heat from the electronic device to be cooled to the dielectric fluid via, in part, vaporization of the dielectric fluid.

7. A cooling apparatus comprising: a housing configured to at least partially surround and form a sealed compartment about an electronic device to be cooled; a dielectric fluid disposed within the sealed compartment, wherein the electronic device to be cooled is at least partially immersed within the dielectric fluid; and at least one pump disposed within the sealed compartment for actively pumping the dielectric fluid disposed within the sealed compartment towards the electronic device to be cooled, and wherein the electronic device to be cooled comprises a stack of integrated circuit chips, wherein the at least one pump further comprises a first pump and a second pump disposed within the sealed compartment for facilitating cooling of the stack of integrated circuit chips, the first pump being configured to actively pump the dielectric fluid towards a top of the stack of integrated circuit chips, and the second pump being configured to actively pump the dielectric fluid into interstitial spaces between integrated circuit chips of the stack of integrated circuit chips.

8. The cooling apparatus of claim 7, further comprising a fluid boiling heat sink coupled to the top of the stack of integrated circuit chips, wherein the first pump actively pumps the dielectric fluid towards the fluid boiling heat sink coupled to the top of the stack of integrated circuit chips, the fluid boiling heat sink comprising a plurality of pin fins extending away from the stack of integrated circuit chips which facilitate transfer of heat from the stack of integrated circuit chips to the dielectric fluid via, in part, vaporization of the dielectric fluid.

9. The cooling apparatus of claim 7, further comprising a plurality of condenser fins extending into the sealed compartment in an upper portion of the sealed compartment, the plurality of condenser fins facilitating cooling of dielectric fluid vapor rising to the upper portion of the sealed compartment, wherein the plurality of condenser fins extend from a top wall of the housing downward into the sealed compartment, and wherein the top wall of the housing is coupled to one of a liquid-cooled cold plate or an air-cooled heat sink for cooling the plurality of condenser fins.

10. The cooling apparatus of claim 9, further comprising an at least partially submerged baffle disposed within the sealed compartment adjacent to at least one side of the stack of integrated circuit chips to facilitate directing of the dielectric fluid vapor to the upper portion of the sealed compartment, and away from the dielectric fluid in a lower portion of the sealed compartment being drawn into the first pump and the second pump for active cooling of the stack of integrated circuit chips.

11. The cooling apparatus of claim 7, further comprising a manifold structure disposed adjacent one or more sides of the stack of integrated circuit chips for facilitating the second pump's active pumping of the dielectric fluid into the interstitial spaces between the integrated circuit chips of the stack of integrated circuit chips.

12. The cooling apparatus of claim 7, wherein a back surface of at least one integrated circuit chip in the stack of integrated circuit chips comprises channels configured to function as dielectric fluid flow passages to facilitate cooling of the integrated circuit chips of the stack of integrated circuit chips, and wherein the cooling apparatus further comprises at least one nozzle coupled to a pump outlet tube of the second pump and extending into the interstitial spaces between the integrated circuit chips for delivering the dielectric fluid directly into the interstitial spaces in the stack of integrated circuit chips.

13. A cooled electronic module comprising: a substrate and an electronic device to be cooled, the electronic device being disposed above the substrate; and a cooling apparatus for cooling the electronic device, the cooling apparatus comprising: a housing configured to at least partially surround and form a sealed compartment about the electronic device, the sealed compartment being fluid-tight; a dielectric fluid disposed within the sealed compartment, wherein the electronic device to be cooled is at least partially immersed within the dielectric fluid; at least one pump disposed within the sealed compartment for actively pumping the dielectric fluid disposed within the sealed compartment towards the electronic device, the at least one pump comprising an impingement-cooling, immersed pump disposed within the sealed compartment, the impingement-cooling, immersed pump actively pumping the dielectric fluid drawn via an inlet from a lower region of the sealed compartment towards the electronic device to be cooled; and an at least partially submerged baffle disposed adjacent to at least one side of the electronic device to be cooled to facilitate directing of dielectric fluid vapor to an upper region of the sealed compartment, and away from the dielectric fluid in the lower region of the sealed compartment being drawn into the impingement-cooling, immersed pump for active pumping via an outlet towards the electronic device to be cooled, wherein the inlet and the outlet of the impingement-cooling, immersed pump are disposed on different sides of the at least partially submerged baffle.

14. The cooled electronic module of claim 13, wherein the housing is sealed to one of the substrate or a structure coupled to the substrate to form the sealed compartment, and wherein the sealed compartment is partially filled with the dielectric fluid, and wherein the cooling apparatus further comprises a plurality of condenser fins extending into the sealed compartment in the upper region of the sealed compartment, the plurality of condenser fins facilitating cooling of the dielectric fluid vapor rising to the upper region of the sealed compartment, wherein the plurality of condenser fins extend from a top wall of the housing downward into the sealed compartment, and wherein the top wall of the housing is coupled to one of a liquid-cooled cold plate or an air-cooled heat sink for cooling the plurality of condenser fins.

15. The cooled electronic module of claim 13, wherein the cooling apparatus further comprises a manifold structure disposed within the sealed compartment over the electronic device to be cooled, the manifold structure comprising a submerged jet impingement plenum with jet orifices for directing dielectric fluid jets towards the electronic device to be cooled, wherein the at least one pump actively pumps the dielectric fluid under pressure into the submerged jet impingement plenum for delivery through the jet orifices as the dielectric fluid jets directed towards the electronic device to be cooled, and wherein the cooling apparatus further comprises a fluid boiling heat sink disposed within the sealed compartment and coupled to the electronic device to be cooled, the fluid boiling heat sink being disposed such the dielectric fluid jets directed from the submerged jet impingement plenum impinge on the fluid boiling heat sink, the fluid boiling heat sink comprising a plurality of pin fins extending away from the electronic device to be cooled which facilitate transfer of heat from the electronic device to the dielectric fluid via, in part, vaporization of the dielectric fluid.

16. The cooled electronic module of claim 13, wherein the electronic device to be cooled comprises a stack of integrated circuit chips, and the at least one pump further comprises a first pump and a second pump disposed within the sealed compartment for facilitating cooling of the stack of integrated circuit chips, the first pump being configured to actively pump the dielectric fluid towards a top of the stack of integrated circuit chips, and the second pump being configured to actively pump the dielectric fluid into interstitial spaces between integrated circuit chips of the stack of integrated circuit chips, and wherein the cooling apparatus further comprises a fluid boiling heat sink coupled to the top of the stack of integrated circuit chips, the first pump being configured to actively pump the dielectric fluid towards the fluid boiling heat sink coupled to the top of the stack of integrated circuit chips, and wherein the cooling apparatus further comprises a plurality of condenser fins extending into the sealed compartment in the upper region of the sealed compartment, the plurality of condenser fins facilitating cooling of the dielectric fluid vapor rising to the upper region of the sealed compartment, and wherein the plurality of condenser fins extend from a top wall of the housing downward into the sealed compartment, the top wall of the housing being coupled to one of a liquid-cooled cold plate or an air-cooled heat sink for cooling the plurality of condenser fins.

17. The cooled electronic module of claim 13, wherein the electronic device to be cooled comprises a stack of integrated circuit chips, and wherein the at least one pump further comprises a first pump and a second pump disposed within the sealed compartment for facilitating cooling of the stack of integrated circuit chips, the first pump being configured to actively pump the dielectric fluid towards a top of the stack of integrated circuit chips, and the second pump being configured to actively pump the dielectric fluid into interstitial spaces between integrated circuit chips of the stack of integrated circuit chips, and wherein a back surface of at least one integrated circuit chip in the stack of integrated circuit chips comprises channels configured to function as dielectric fluid flow passages to facilitate cooling of the integrated circuit chips in the stack of integrated circuit chips, and wherein the cooling apparatus further comprises at least one nozzle coupled to a pump outlet tube of the second pump and extending into the interstitial spaces between the integrated circuit chips for delivering the dielectric fluid directly into the interstitial spaces in the stack of integrated circuit chips.

18. A method of fabricating a cooled electronic module comprising: securing a housing about an electronic device to be cooled, the housing being configured to at least partially surround and form a sealed compartment about the electronic device to be cooled; disposing dielectric fluid within the sealed compartment, wherein the electronic device to be cooled is at least partially immersed within the dielectric fluid; disposing at least one pump within the sealed compartment for actively pumping the dielectric fluid disposed within the sealed compartment towards the electronic device to be cooled, wherein the at least one pump comprises an impingement-cooling, immersed pump disposed within the sealed compartment and configured to actively pump the dielectric fluid drawn from a lower region of the sealed compartment towards the electronic device to be cooled; and providing an at least partially submerged baffle disposed adjacent to at least one side of the electronic device to be cooled to facilitate directing of dielectric fluid vapor to an upper region of the sealed compartment, and away from the dielectric fluid in the lower region of the sealed compartment being drawn into the impingement-cooling, immersed pump for active pumping via an outlet towards the electronic device to be cooled, wherein the inlet and the outlet of the impingement-cooling, immersed pump are disposed on different sides of the at least partially submerged baffle.

\* \* \* \* \*